US010612925B2

(12) United States Patent
Najafi et al.

(10) Patent No.: US 10,612,925 B2
(45) Date of Patent: Apr. 7, 2020

(54) ASSEMBLY PROCESSES FOR THREE-DIMENSIONAL MICROSTRUCTURES

(71) Applicant: The Regents of The University of Michigan, Ann Arbor, MI (US)

(72) Inventors: Khalil Najafi, Ann Arbor, MI (US); Jae Yoong Cho, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 34 days.

(21) Appl. No.: 16/080,957

(22) PCT Filed: Feb. 28, 2017

(86) PCT No.: PCT/US2017/019911
§ 371 (c)(1),
(2) Date: Aug. 29, 2018

(87) PCT Pub. No.: WO2017/200621
PCT Pub. Date: Nov. 23, 2017

(65) Prior Publication Data
US 2019/0094024 A1 Mar. 28, 2019

Related U.S. Application Data

(60) Provisional application No. 62/301,049, filed on Feb. 29, 2016.

(51) Int. Cl.
*H01L 21/00* (2006.01)
*G01C 19/5691* (2012.01)
(Continued)

(52) U.S. Cl.
CPC ........ *G01C 19/5691* (2013.01); *B81C 1/0019* (2013.01); *B81C 1/00182* (2013.01);
(Continued)

(58) Field of Classification Search
CPC ............ G01C 19/5691; B81C 1/00182; B81C 1/0019; B81C 1/00626; B81C 3/002; B81C 3/0072
See application file for complete search history.

(56) References Cited

U.S. PATENT DOCUMENTS 4,951,508 A    8/1990  Loper, Jr. et al.
5,725,729 A *  3/1998  Greiff .................. B81C 1/0019
                                                    216/11
(Continued)

FOREIGN PATENT DOCUMENTS

WO    WO-2011138057 A2    11/2011

OTHER PUBLICATIONS

J. Sung, et al., "A gyroscope fabrication method for high sensitivity and robustness to fabrication tolerances", Journal of Micromechanics and Microengineering 24.7 (2014).
(Continued)

*Primary Examiner* — Richard A Booth
(74) *Attorney, Agent, or Firm* — Harness, Dickey & Pierce, P.L.C.

(57) ABSTRACT

Three-dimensional microstructure devices having substantially perfect alignment and leveling of a three-dimensional microstructure with respect to a substrate having a plurality of discrete electrodes and relating fabricating methods are disclosed. Seed layers are deposited onto the discrete electrodes of the substrate, and the three-dimensional microstructure is bonded adjacent to the seed layers. A substantially uniform sacrificial layer is deposited onto exposed surfaces of the three-dimensional microstructure. A plurality of first gaps exists between the seed layers and corresponding regions of the sacrificial layer. Conductive layers are deposited to fill the first gaps. The sacrificial layer is dissolved to create a second plurality of gaps between the conductive layers and the corresponding regions of the
(Continued)

Figure 1A:
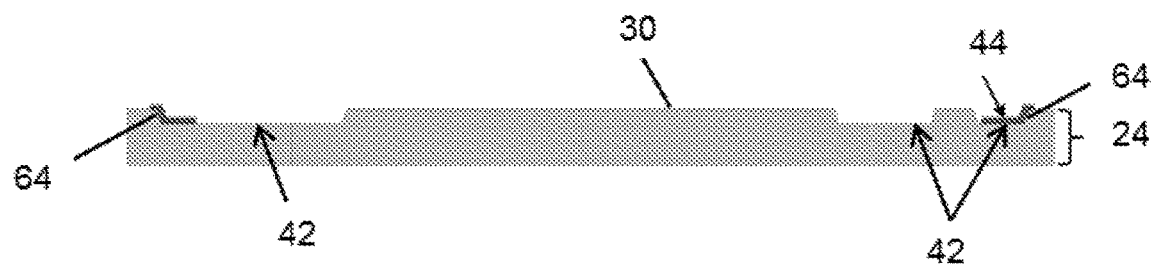

three-dimensional microstructure. The second gaps are substantially uniform.

20 Claims, 32 Drawing Sheets

(51) Int. Cl.
*B81C 1/00* (2006.01)
*B81C 3/00* (2006.01)
*H03H 3/007* (2006.01)
*H03H 3/013* (2006.01)
*H03H 9/46* (2006.01)

(52) U.S. Cl.
CPC .......... *B81C 1/00626* (2013.01); *B81C 3/002* (2013.01); *H03H 3/0072* (2013.01); *H03H 3/013* (2013.01); *H03H 9/462* (2013.01); *B81B 2201/0242* (2013.01)

(56) References Cited

U.S. PATENT DOCUMENTS

| | | | |
|---|---|---|---|
| 6,674,585 B1 | 1/2004 | Calvet et al. | |
| 7,358,580 B2 | 4/2008 | Ma et al. | |
| 7,542,195 B2 | 6/2009 | Yang | |
| 7,581,443 B2 | 9/2009 | Kubena et al. | |
| 8,631,702 B2 | 1/2014 | Horning et al. | |
| 8,661,681 B2 | 3/2014 | Fussinger et al. | |
| 9,494,425 B2 | 11/2016 | Najafi et al. | |
| 9,796,586 B2 | 10/2017 | Najafi et al. | |
| 2002/0026724 A1 | 3/2002 | Moon et al. | |
| 2004/0150057 A1 | 8/2004 | Hsu et al. | |
| 2006/0057816 A1* | 3/2006 | Benzel | G01L 9/0045 438/424 |
| 2007/0254442 A1 | 11/2007 | Manger et al. | |
| 2010/0143848 A1* | 6/2010 | Jain | B81C 1/0019 430/315 |
| 2013/0160578 A1 | 6/2013 | Najafi et al. | |
| 2013/0285259 A1 | 10/2013 | Han | |
| 2014/0068931 A1 | 3/2014 | Horning et al. | |
| 2015/0091107 A1 | 4/2015 | Wang | |

OTHER PUBLICATIONS

S. Lee et al., "Fabrication of Vertical Comb Electrodes Using Selective Anodic Bonding", Proc. 20th IEEE International Conference on Micro Electro Mechanical Systems (MEMS'07), Kobe, Japan (2007).

T. Iizuka et al., "Electrostatic Micro Actuators with High-Aspect-Ratio Driving Gap for Hard Disk Drive Application", In: Proceedings of 2000 Internatinal Symposium on Micromechatronics and Human Science, IEEE, Oct. 25, 2000, pp. 229-236.

* cited by examiner

ASSEMBLY PROCESSES FOR THREE-DIMENSIONAL MICROSTRUCTURES

CROSS-REFERENCE TO RELATED APPLICATIONS

This application is a 371 National Phase of PCT/US2017/019911 filed Feb. 28, 2017 and published in English as WO 2017/200621 A1 on Nov. 23, 2017, which claims the benefit of U.S. Provisional Patent Application No. 62/301,049 filed on Feb. 29, 2016. The entire disclosures of the above applications are incorporated herein by reference.

GOVERNMENT

This invention was made with government support under Grant No. W31P4Q-11-1-0002 awarded by the Defense Advanced Research Projects Agency. The Government has certain rights in this invention.

FIELD

The present disclosure relates to assembly processes for three-dimensional microstructures.

BACKGROUND

Recent advances in micro electromechanical system ("MEMS") technology has resulted in the successful commercialization of high-performance sensors and actuators in a variety of applications, including motion sensing, wireless communication, energy harvesting, and healthcare. Micro assembly processes are generally employed for producing complex micro sensors and actuators. However, micro assembly processes have notable limitations. For example, the throughput of micro assembly processes is lower than that of batch fabrication approaches. Additionally, the alignment accuracy of micro assembly processes is inferior for the production of high performance capacitive sensors and actuators.

Further, it is preferable that objects to be aligned have alignment marks and are observable under a microscope during assembly. However, in many cases, alignment marks cannot be patterned onto the objects because of the microfabrication processed used. Additionally, objects to be aligned are commonly covered by other objects during microfabrication causing the objects to be unobservable during assembly. Jigs are used to align objects that are difficult to see under a microscope. However, the jigs must be accurately aligned with the objects and using conventional alignment tools it can be difficult to achieve high alignment accuracy.

Further, the micro assembled devices can have large variances in nominal capacitances across devices, as well as poor uniformity in capacitance values between electrodes in a single device, because of the low reliability of the fabrication processes of the individual components. For example, the inaccurate alignment and low capacitance uniformity negatively impacts the functionality of micro-shell rate-integrating gyroscopes. Micro shell rate-integrating gyroscopes comprise a micro scale shell resonator anchored on a substrate having multiple electrodes for capacitively actuating and sensing the vibrating pattern of the shell resonator.

Ideally high-performance micro-shell rate-integrating gyroscopes have (1) perfect leveling of the micro-shell resonator to the substrate; (2) small controllable gaps, for example less than 5 µm, between the micro-shell resonator and the electrodes of the substrate; (3) large controllable gap sizes in other regions, excluding that between the micro-shell resonator and the electrodes of the substrate; and (4) uniform gaps between the micro-shell resonator and all surrounding electrodes. Contemporary microfabrication processes are generally unable to produce device having all of these properties. Thus, there is a continued need for micro assembly processes allowing for the creation of high-performance micro-shell rate-integrating gyroscopes having these features.

This section provides background information related to the present disclosure which is not necessarily prior art.

SUMMARY

In various aspects, the present disclosure provides an exemplary method for fabricating a microstructure device. The method includes forming a microstructure on a substrate. The substrate includes a plurality of discrete electrodes. The microstructure is formed adjacent to the discrete electrodes. A first plurality of gaps exists between the deposited microstructure and the discrete electrodes. A substantially uniform sacrificial layer is deposited onto the exposed surfaces of the microstructure. A plurality of conductive layers is deposited to fill the first gaps. The sacrificial layer is then dissolved to release the microstructure and to create a second plurality of gaps between the microstructure and the conductive layer. Each second gap has a width that is smaller than that of the corresponding first gap. The second gaps of the second plurality of gaps are substantially uniform with each other In one variation, the method further includes depositing a plurality of seed layers onto the discrete electrodes. The microstructures are deposited adjacent to the deposited seed layers and the first gap is defined between the seed layers and the discrete electrodes.

In one variation, the conductive layers are deposited using chemical vapor deposition.

In one variation, the conductive layers are deposited using electroplating techniques.

In one variation, the depositing of each conductive layer continues until the respective conductive layer makes contact with a corresponding region of the sacrificial layer.

In one variation, the depositing of each conductive layer within the corresponding first gap continues until the respective conductive layer makes contact with a corresponding region of the sacrificial layer.

In one variation, the conductive layer is selected from the group consisting of: copper, nickel, tin, indium, zinc, gold, silver, platinum, rhodium, lead, palladium, zinc, zinc-nickel, palladium-nickel, palladium-cobalt, iron, stainless steel, palladium-cobalt, chromium, brass, cadmium, iridium, nickel-chromium, iron-chrome-nickel, tungsten, molybdenum, germanium, aluminum, ruthenium, tin-lead, titanium, aluminum-titanium, cadmium-titanium, carbon, zinc oxide, silicon gallium arsenide, gallium phosphide, indium arsenide, indium antimonide, indium sulfide, lead sulfide, cadmium telluride, cadmium selenide, zinc selenide, zinc telluride, zinc cadmium selenide, cadmium zinc telluride, cadmium sulfide, copper sulfide, indium selenide, copper indium selenide, mercury cadmium telluride, titanium oxide, tungsten oxide, copper oxide, lead oxide, and combinations thereof.

In one variation, the sacrificial layer is dissolved using a process selected from the group consisting of: dry etching, wet etching, combusting, melting, milling, ion bombardment, and combinations thereof.

In one variation, the microstructure is a three-dimensional micro-shell resonator and has a hollow half toroid shape.

In one variation, the substrate includes a leveling layer that supports at least a portion of the microstructure as the microstructure is coupled to the substrate.

In one variation, the microstructure includes a rim and an anchor, and the substrate includes a mounting surface. The anchor of the microstructure is bonded to the mounting surface of the substrate.

In one variation, the microstructure includes a rim and an anchor, and the substrate includes a leveling layer. The leveling layer supports a portion of the rim during the bonding of the anchor to the mounting surface. The leveling layer is removed after bonding.

In one variation, the substrate includes a plurality of movable jigs. The movable jigs apply a compressive force to align the microstructure with the substrate. After alignment of the microstructure and substrate, the microstructure is bonded to the substrate and the movable jigs released.

In one variation, the substrate includes a plurality of fixed jigs. The fixed jigs define an opening. The microstructure is deposited within the defined opening.

In other aspects, the present disclosure provides another exemplary method for fabricating a three-dimensional microstructure device. The method includes micromachining a substrate to form a plurality of discrete electrodes having a plurality of sidewalls. Seed layers are deposited onto the sidewalls of the discrete electrodes. A substantially uniform sacrificial layer is deposited onto the exposed surfaces of a three-dimensional microstructure. The three-dimensional microstructure is deposited adjacent to the sidewalls of the discrete electrodes to create a first plurality of gaps between the sacrificial layer and the metal layers. A plurality of conductive layers is deposited to fill the first gaps. The depositing of each conductive layer within the corresponding first gap continues until the respective conductive layer makes contact with a corresponding region of the sacrificial layer. The sacrificial layer is then dissolved to release the microstructure and to create a second plurality of gaps between the microstructure and the conductive layer. Each second gap has a width that is smaller than that of the corresponding first gap. The second gaps of the second plurality of gaps are substantially uniform with each other In one variation the plurality of conductive layers are deposited using electroplating techniques.

In one variation, the three-dimensional microstructure includes a rim and an anchor, and the substrate includes a mounting surface. The anchor of the three-dimensional microstructure is bonded to the mounting surface of the substrate.

In one variation, the three-dimensional microstructure includes a rim and an anchor, and the substrate includes a leveling layer. The leveling layer supports a portion of the rim during the bonding of the anchor to the mounting surface. The leveling layer is removed after bonding.

In one variation, the substrate includes a plurality of movable jigs. The movable jigs apply a compressive force to align the microstructure with the substrate. After alignment of the three-dimensional microstructure and substrate, the three-dimensional microstructure is bonded to the substrate and the movable jigs released.

In one variation, the substrate includes a plurality of fixed jigs. The fixed jigs define an opening. The three-dimensional microstructure is deposited within the defined opening.

This section provides a general summary of the disclosure, and is not a comprehensive disclosure of its full scope or all of its features.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 1B:
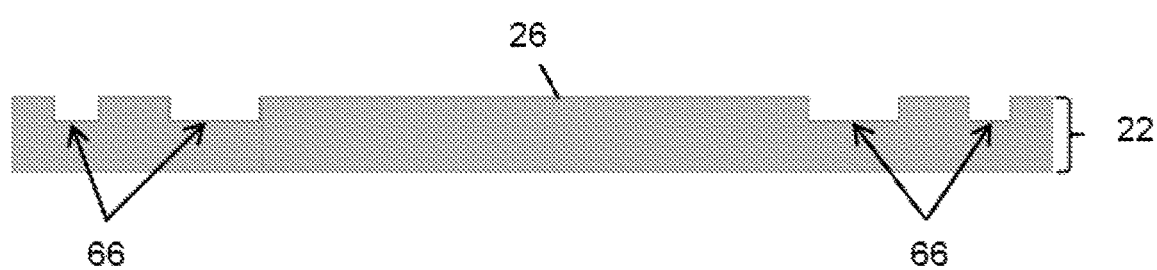
Figure 1C:
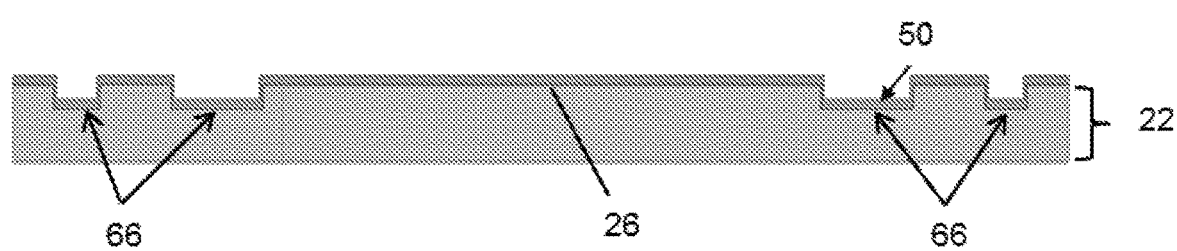
Figure 1D:
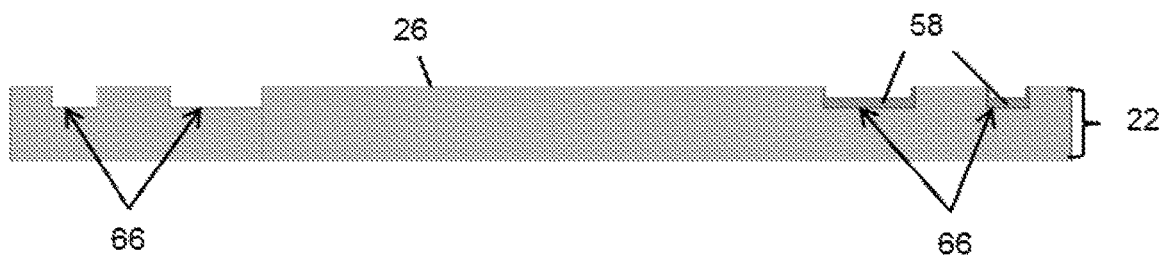
Figure 1E:
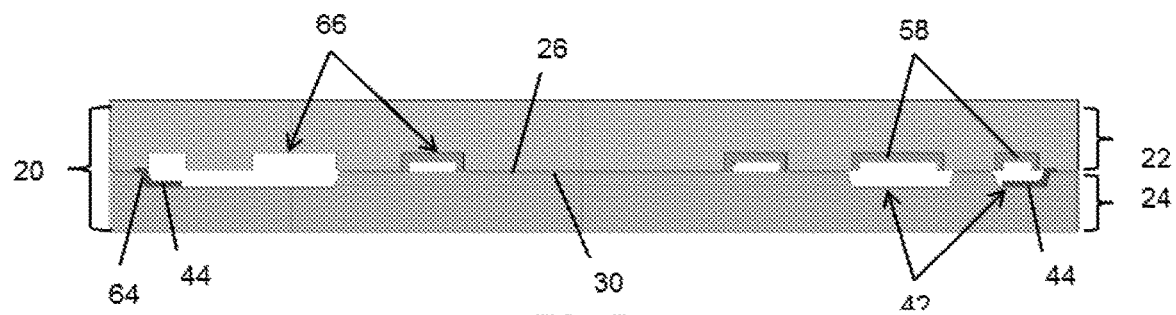
Figure 1F:
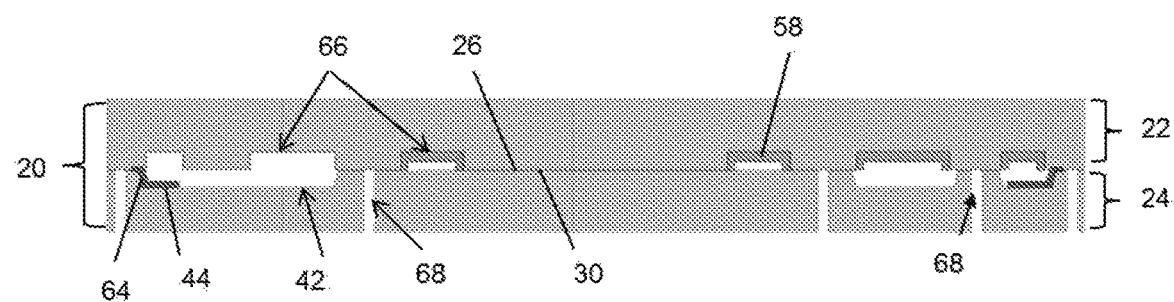
Figure 1G:
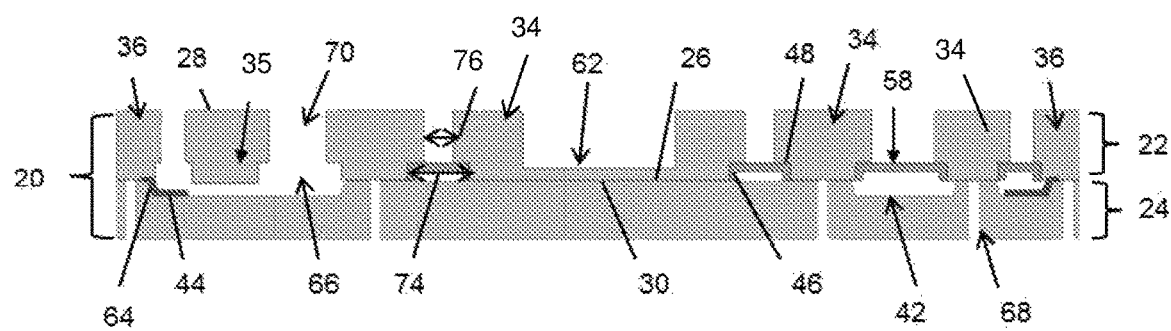
Figure 1H:
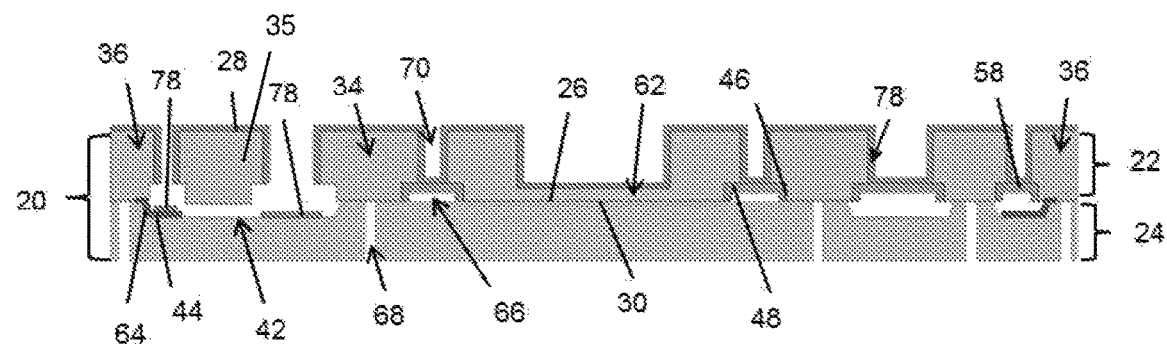
Figure 1I:
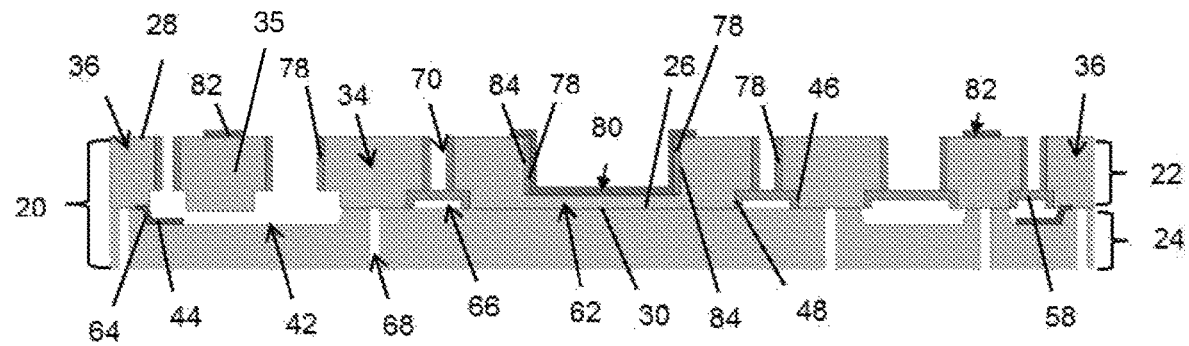
Figure 1J:
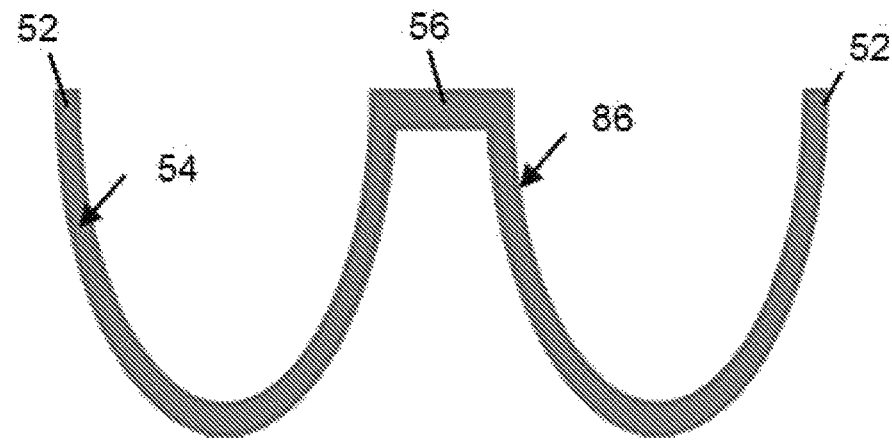
Figure 1K:
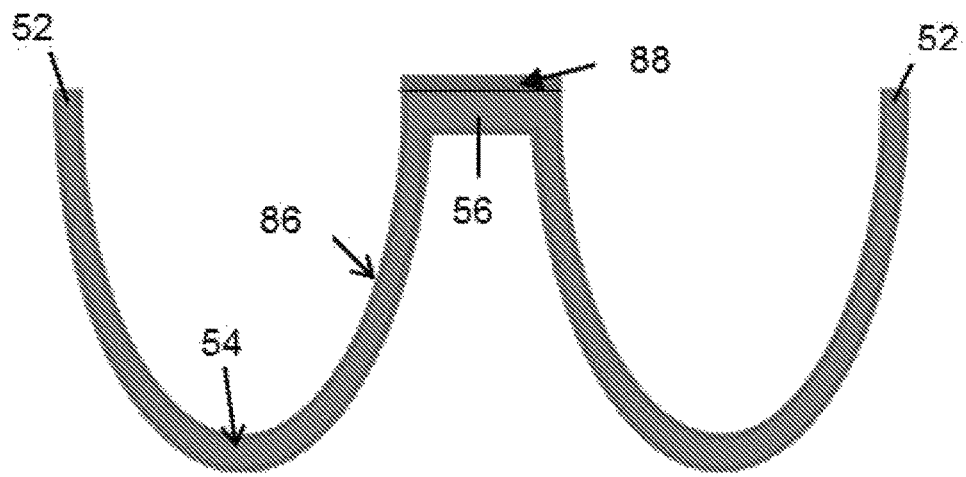
Figure 1L:
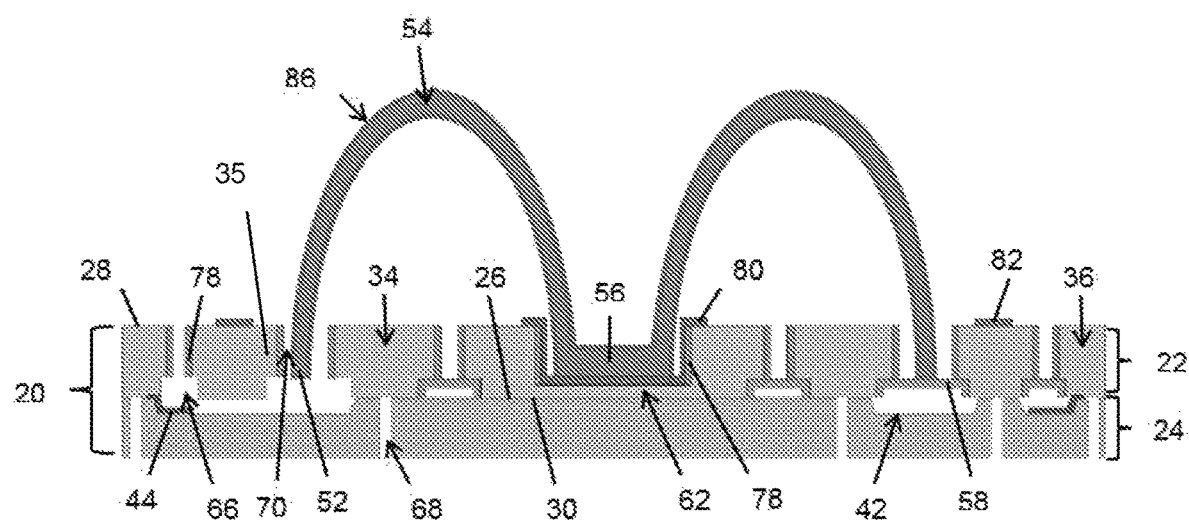
Figure 1M:
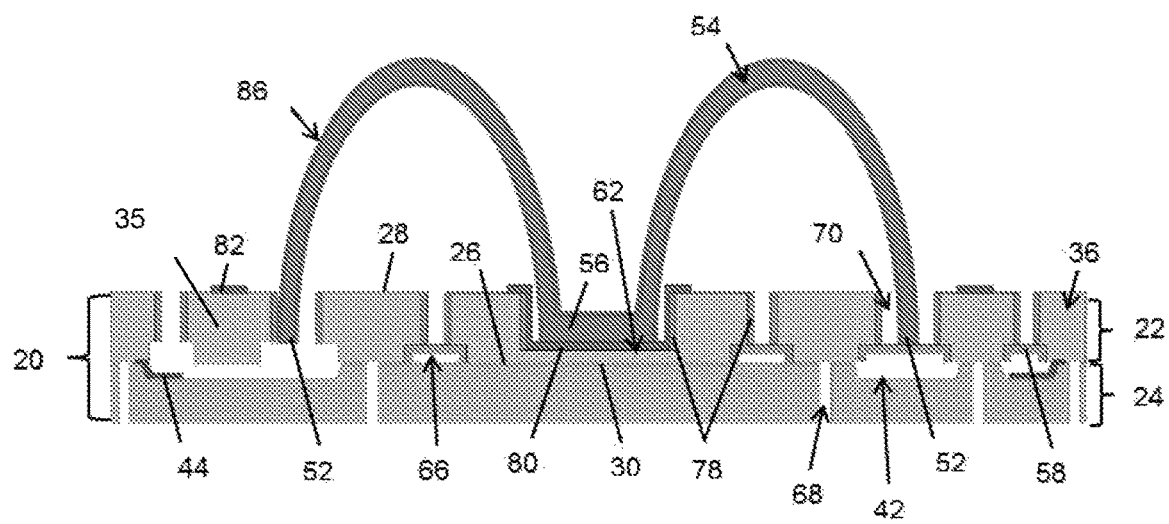
Figure 1N:
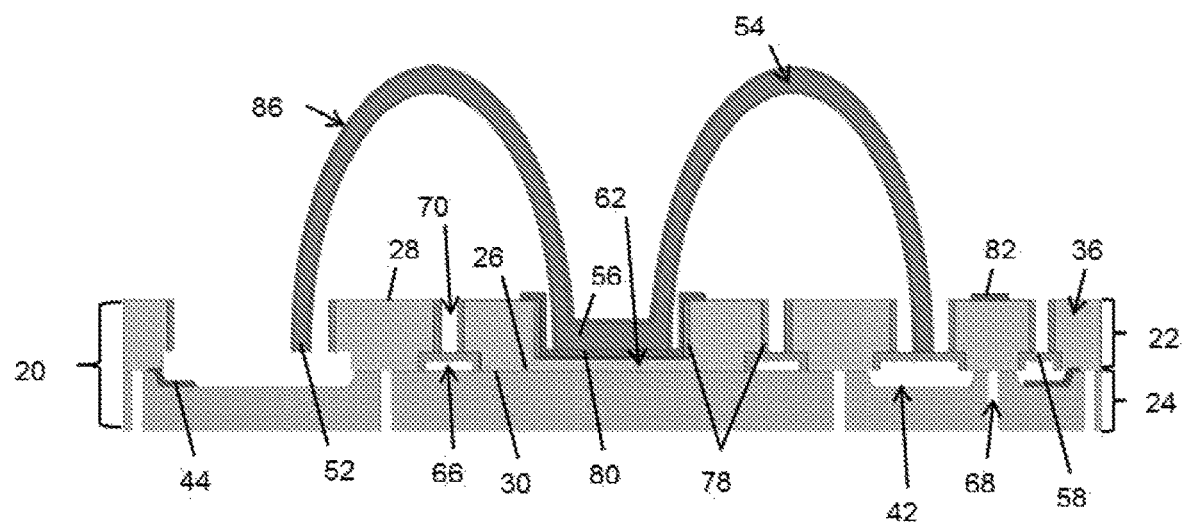
Figure 1O:
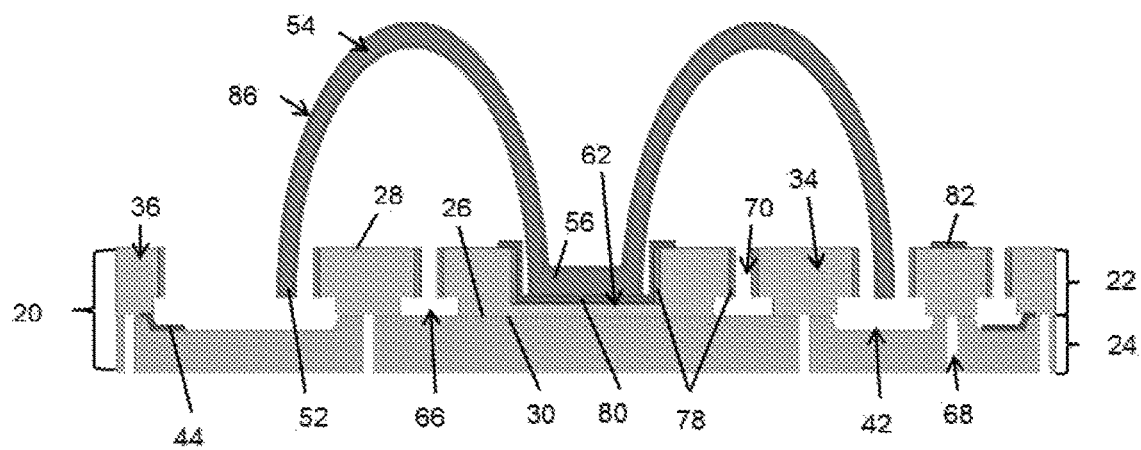
Figure 1P:
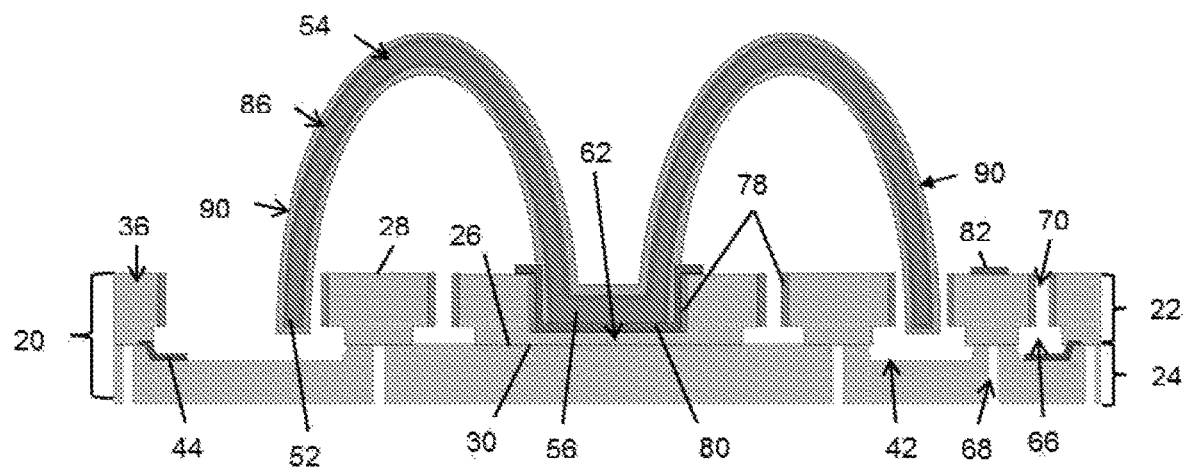
Figure 1Q:
Figure 1R:
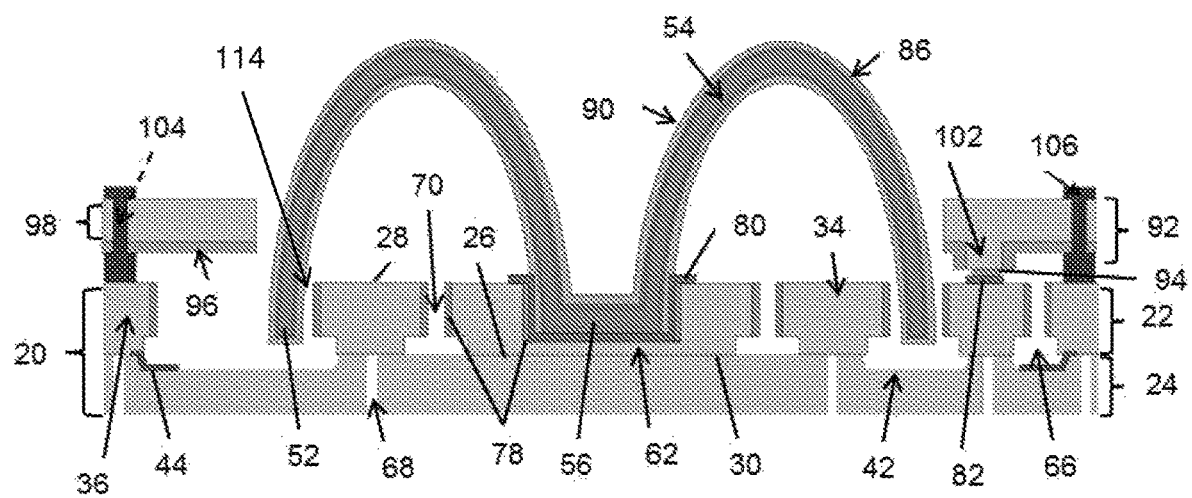
Figure 1S:
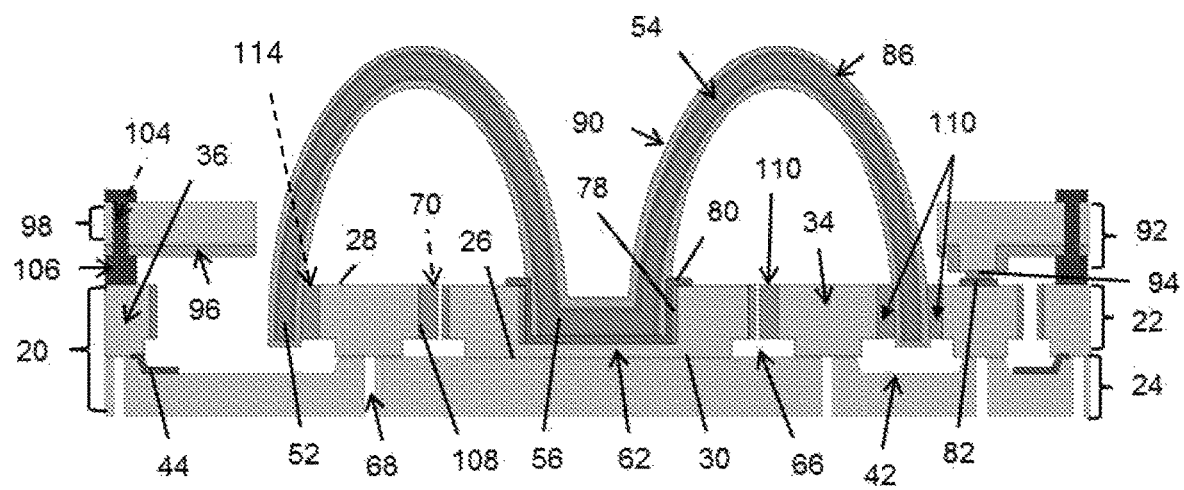
Figure 1T:
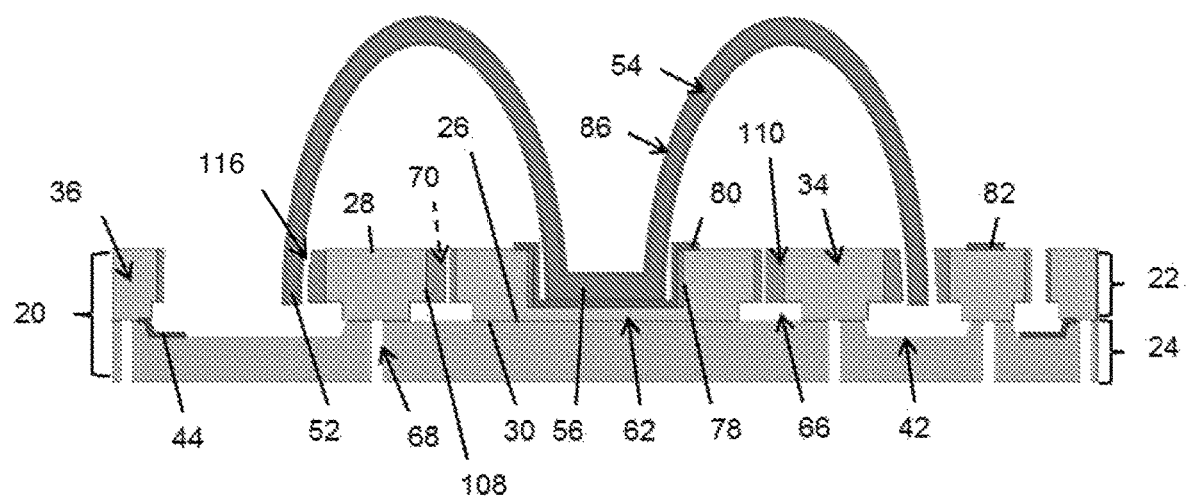
Figure 1U:
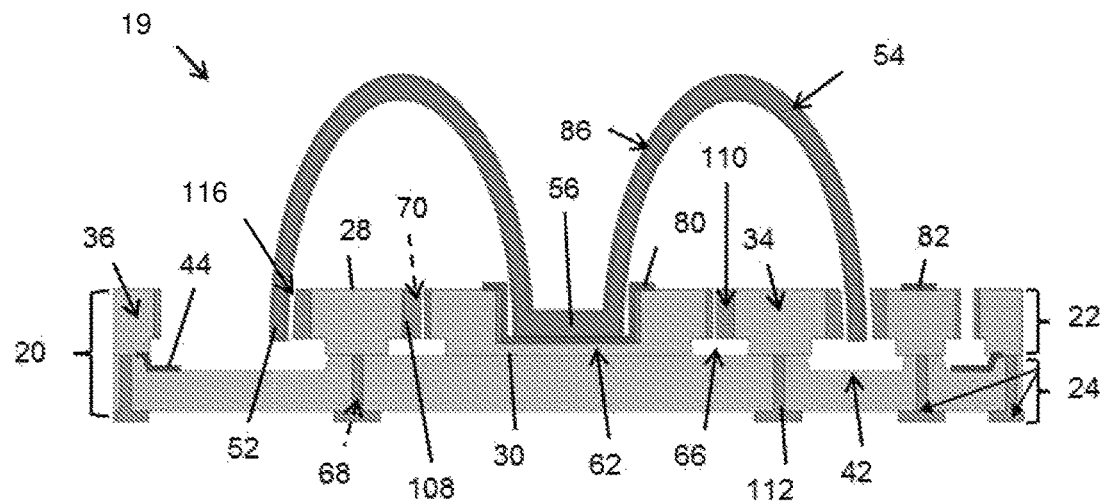

FIGS. 1A-1U are cross-sectional views illustrating exemplary process steps for fabricating an exemplary high-performance vibratory gyroscope using a leveling layer, a movable jig, and a sacrificial layer, wherein the rim of the micro-shell resonator faces the electrode substrate. FIG. 1A shows the patterning of a first substrate to form a plurality of recesses and the deposition of first electrodes within the formed recesses. FIG. 1B shows the patterning of a second substrate to form a plurality of recesses. FIG. 1C shows the deposition of a first layer onto the second substrate and within the formed recesses. FIG. 1D shows the patterning of the first layer to form a plurality of leveling layers. FIG. 1E shows the alignment of the first and second substrates to form an electrode substrate. FIG. 1F shows the patterning of the first substrate to form a plurality of feedthroughs. FIG. 1G shows the patterning of the top substrate to form a boundary, a mounting region, a plurality of discrete electrodes, and a plurality of movable jigs. FIG. 1H shows the deposition of a seed layer onto the exposed surfaces of the first and second substrates. FIG. 1I shows the patterning of the seed layer and the deposition of a plurality of bonding layer and a plurality of contact pads. FIG. 1J shows a micro-shell resonator coated with an electrode layer. FIG. 1K shows the deposition of a bonding layer onto an anchor of the micro-shell resonator. FIG. 1L shows the alignment of the micro-shell resonator and the electrode substrate. FIG. 1M shows the use of the movable jig to move the micro-shell resonator. FIG. 1N shows the release of the movable jig. FIG. 1O shows the removal of the leveling layer. FIG. 1P shows the deposition of a sacrificial layer onto the micro-shell resonator. FIG. 1Q shows the preparation of an electrode connection jig. FIG. 1R shows the alignment of the electrode connection jig and the electrode substrate. FIG. 1S shows the growth of the seed layer to fill the gaps between the micro-shell resonator and the discrete electrodes. FIG. 1T shows the release of the micro-shell resonator. FIG. 1U shows the deposition of the contact pads through the feedthroughs.

Figure 2A:
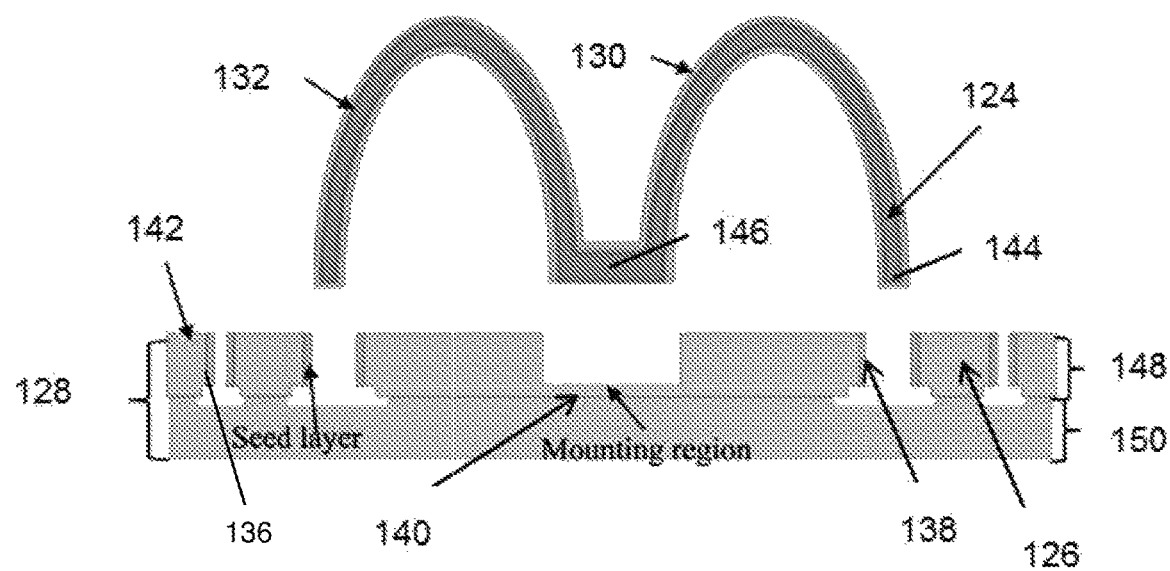
Figure 2B:
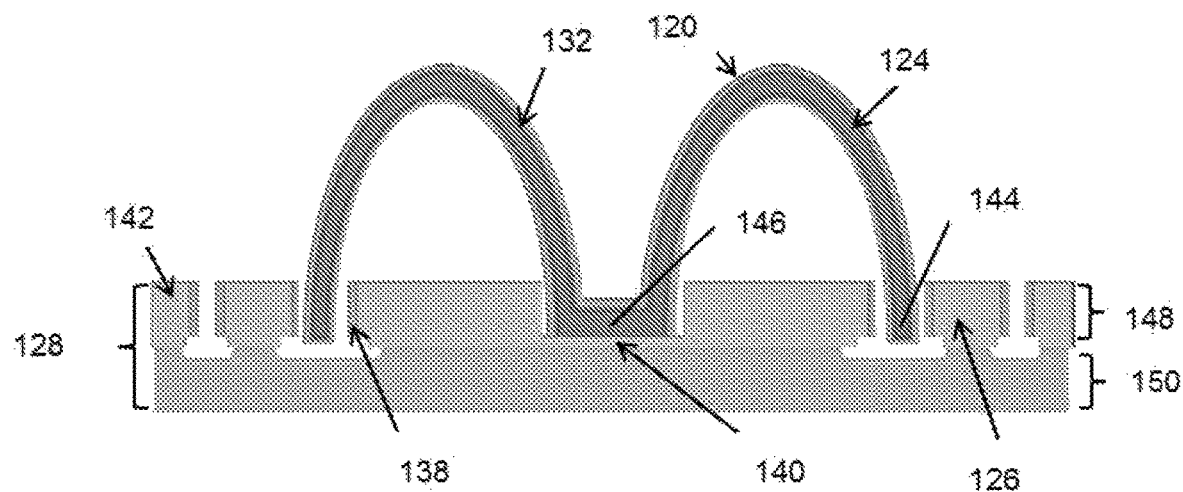
Figure 2C:
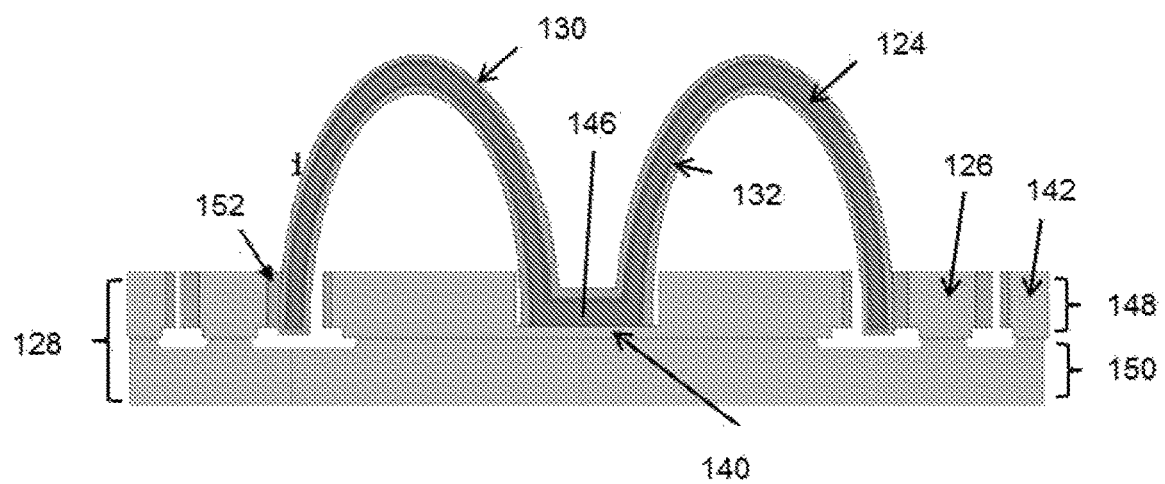
Figure 2D:
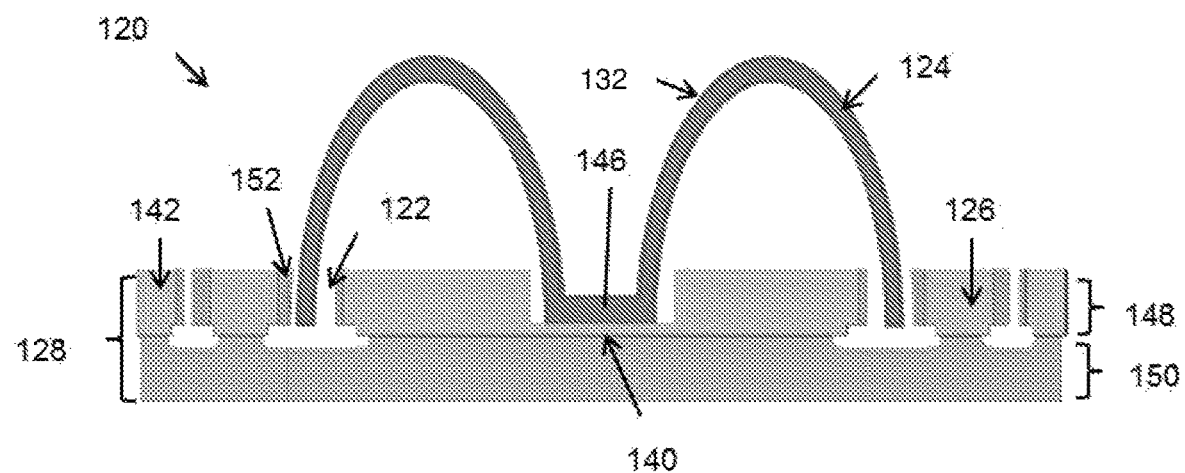

FIGS. 2A-2D are cross-sectional views illustrating exemplary process steps for fabricating another exemplary high-performance vibratory gyroscope using a sacrificial layer similar to the method illustrated in FIGS. 1A-1U. FIG. 2A shows the patterning of a seed layer on the electrode substrate and depositing of a sacrificial layer onto the micro-shell resonator. FIG. 2B shows the bonding of the micro-shell resonator to the electrode substrate. FIG. 2C shows the growth of the seed layers to fill the gaps between the micro-shell resonator and the discrete electrodes. FIG. 2D shows the show the release of the micro-shell resonator.

Figure 3A:
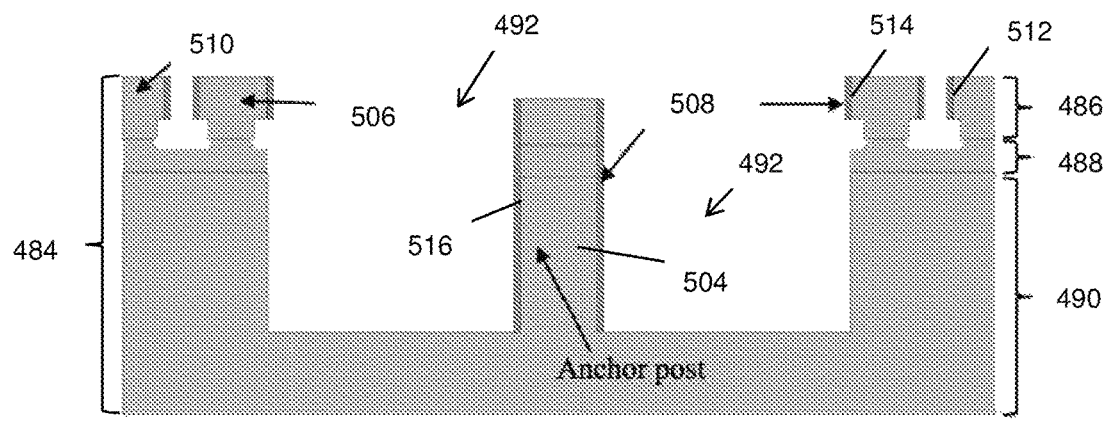
Figure 3B:
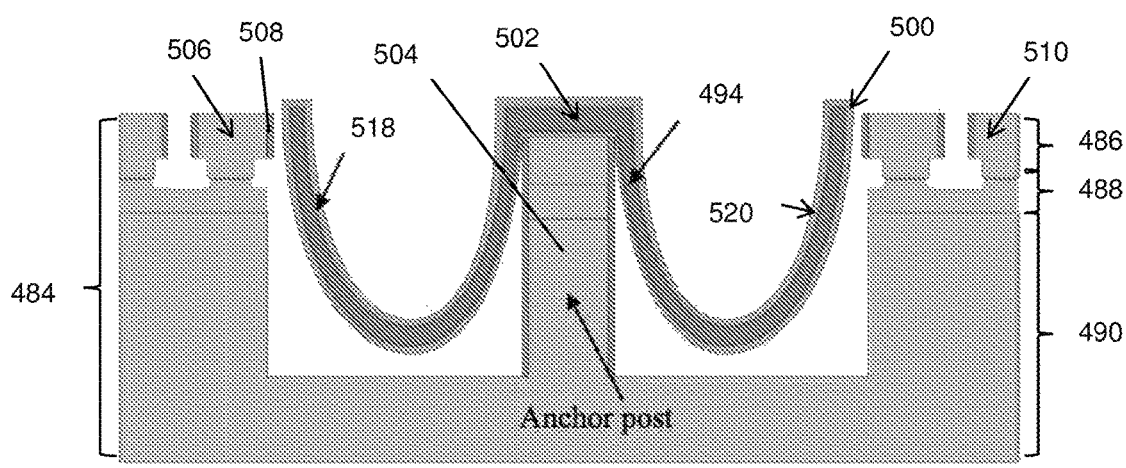
Figure 3C:
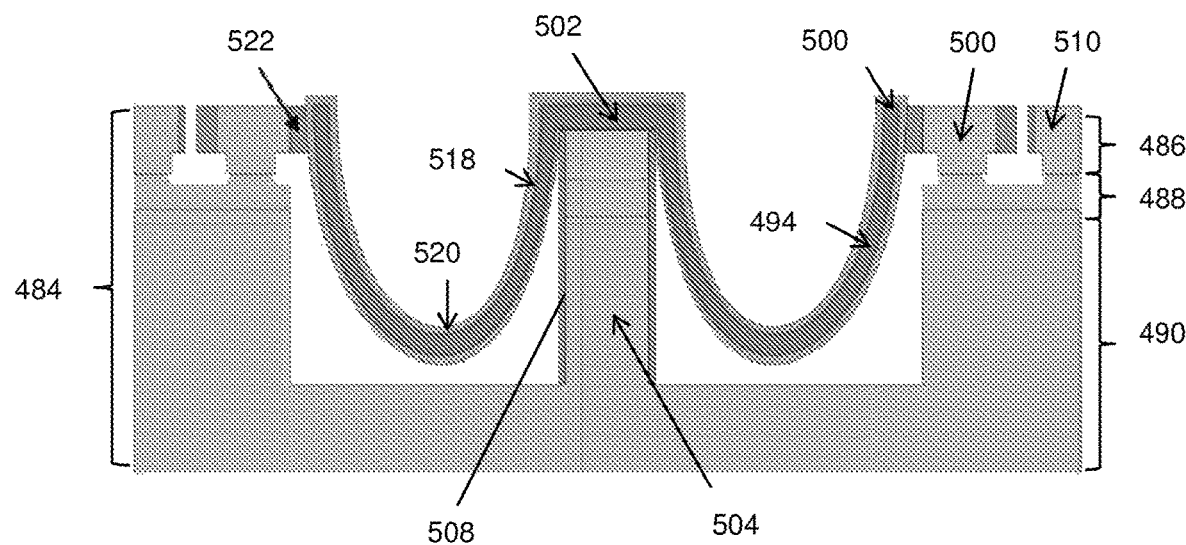
Figure 3D:
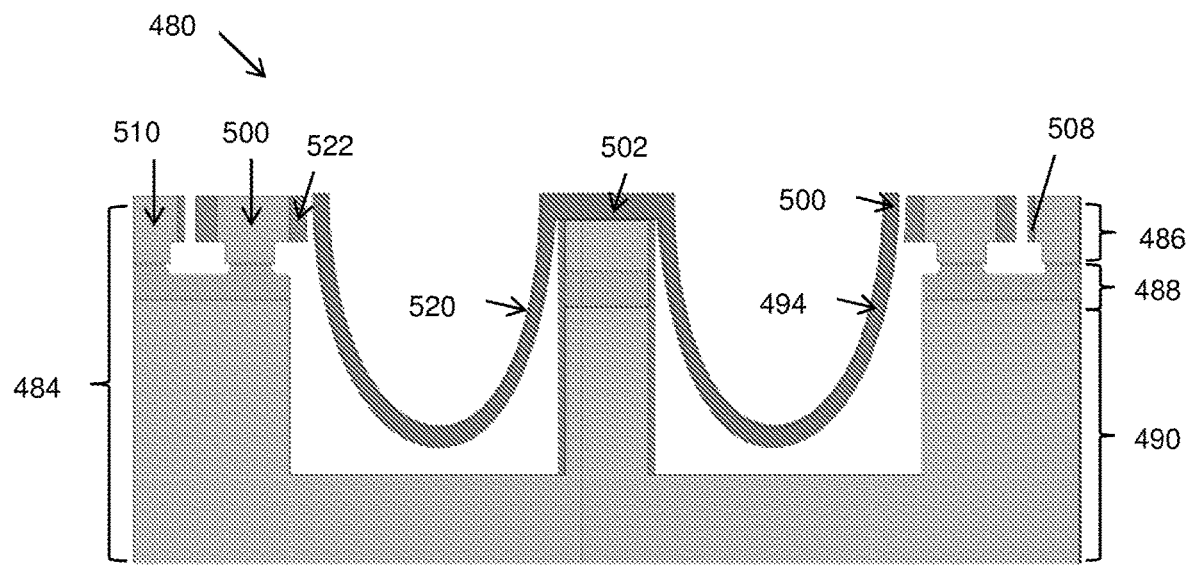

FIGS. 3A-3D are cross-sectional views illustrating exemplary process steps, similar to those illustrated in FIGS. 2A-2B, for fabricating another exemplary high-performance vibratory gyroscope, wherein the rim of the micro-shell resonator faces away from the electrode substrate. FIG. 3A shows the formation of the electrode substrate and the patterning of a seed layer on the electrode substrate. FIG. 3B shows the bonding of the micro-shell resonator to the electrode substrate and the coating of the micro-shell resonator with the sacrificial layer. FIG. 3C shows the growth of the seed layers to fill the gaps between the micro-shell resonator and the discrete electrodes. FIG. 3D shows the release of the micro-shell resonator.

Figure 4A:
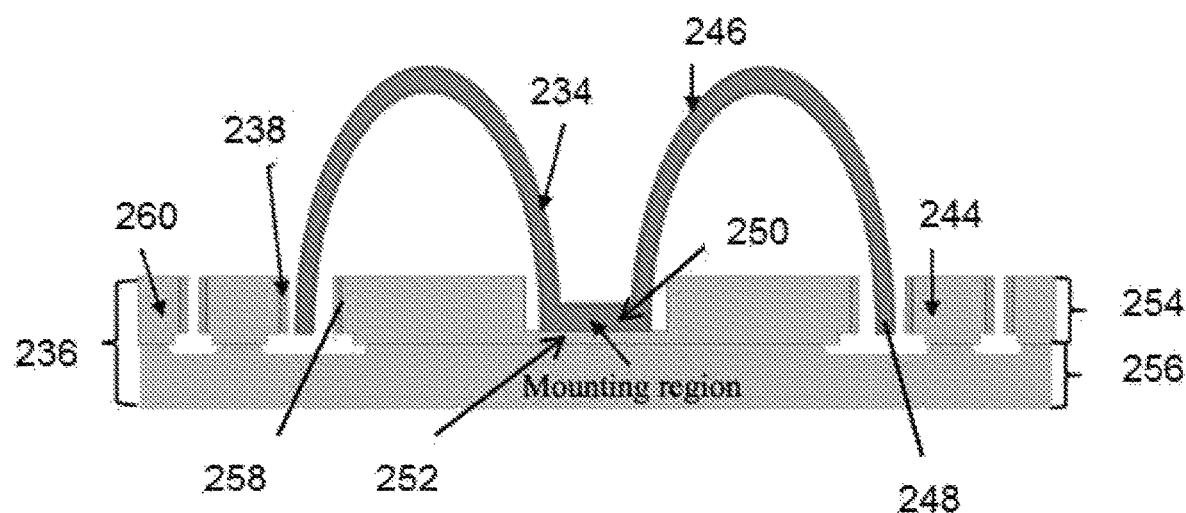
Figure 4B:
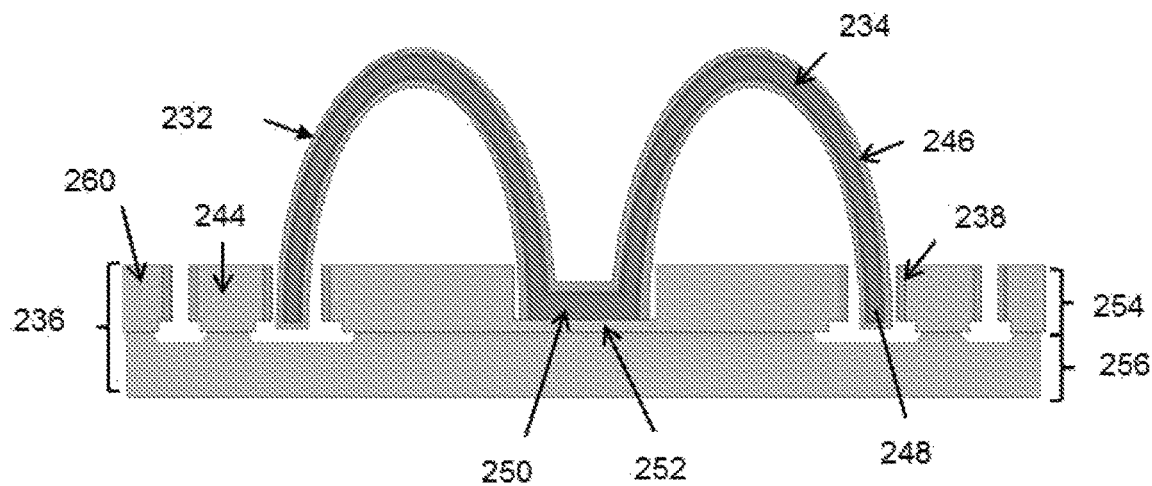
Figure 4C:
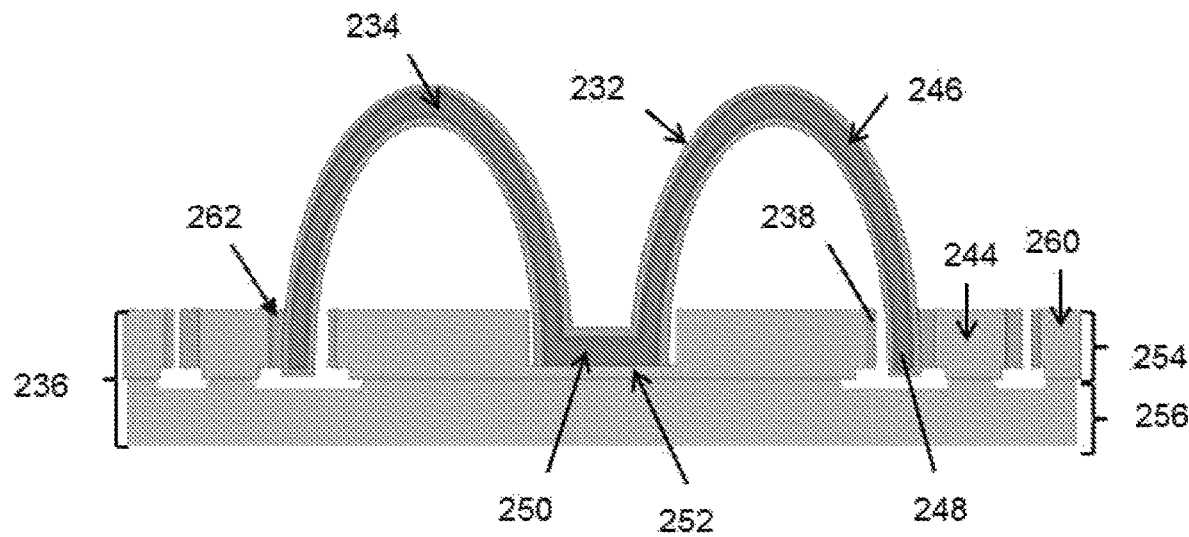
Figure 4D:
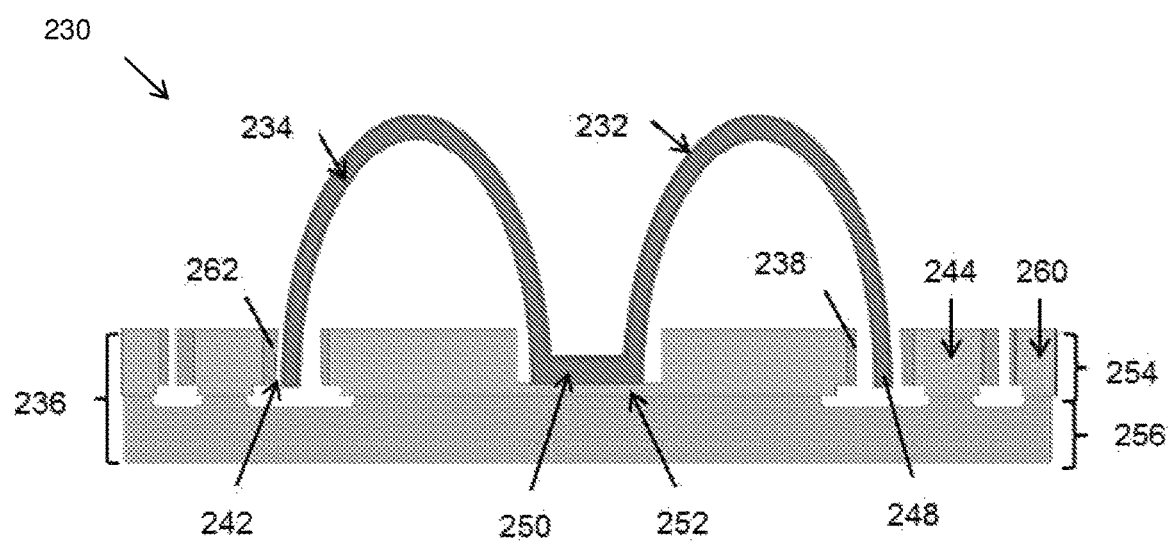

FIGS. 4A-4D are cross-sectional views illustrating exemplary process steps, similar to those illustrated in FIGS. 2A-2B, for fabricating another exemplary high-performance vibratory gyroscope, wherein the sacrificial layer is deposited onto the micro-shell resonator after the resonator is bonded to the electrode substrate. FIG. 4A shows the forming of the micro-shell resonator on the electrode substrate and the patterning of a seed layer on the electrode substrate. FIG. 4B shows the coating of the micro-shell resonator with the sacrificial layer. FIG. 4C shows the growth of the seed layers to fill the gaps between the micro-shell resonator and the discrete electrodes. FIG. 4D shows the release of the micro-shell resonator.

Figure 5A:
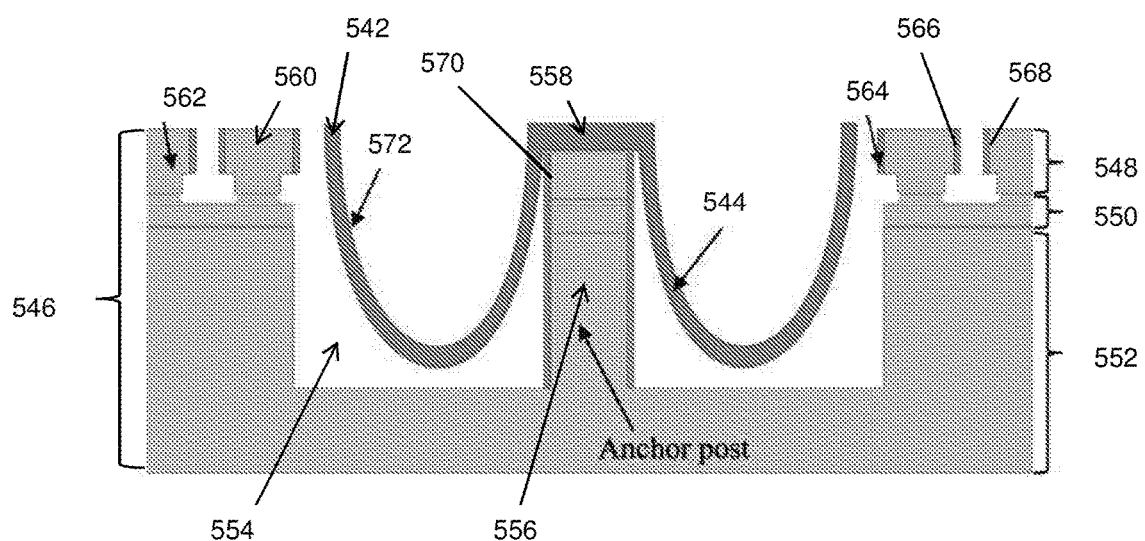
Figure 5B:
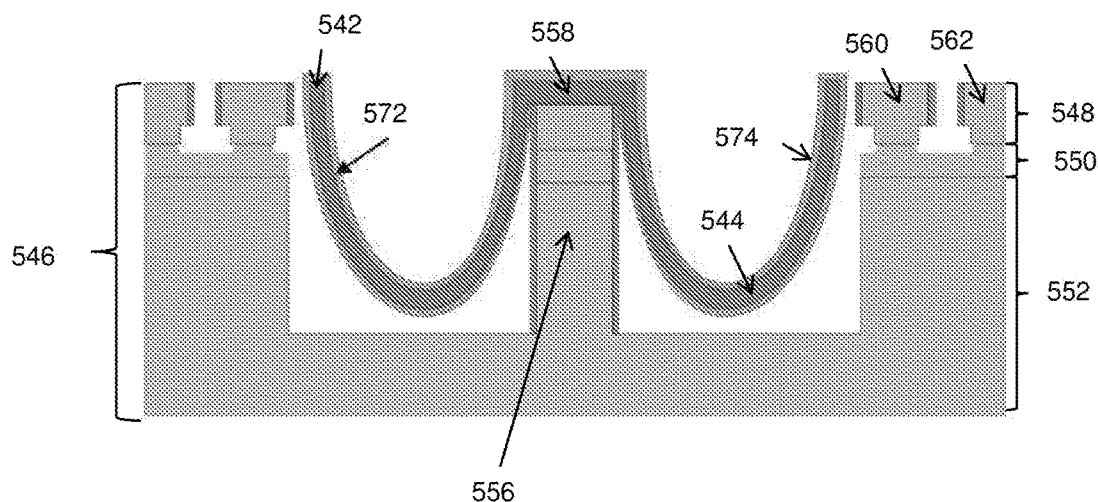
Figure 5C:
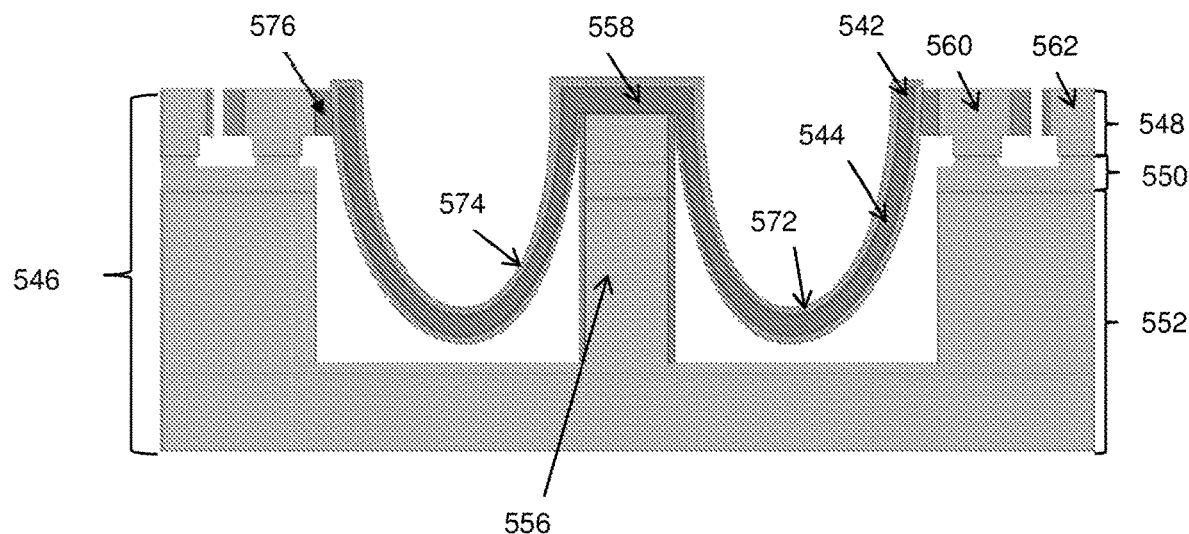
Figure 5D:
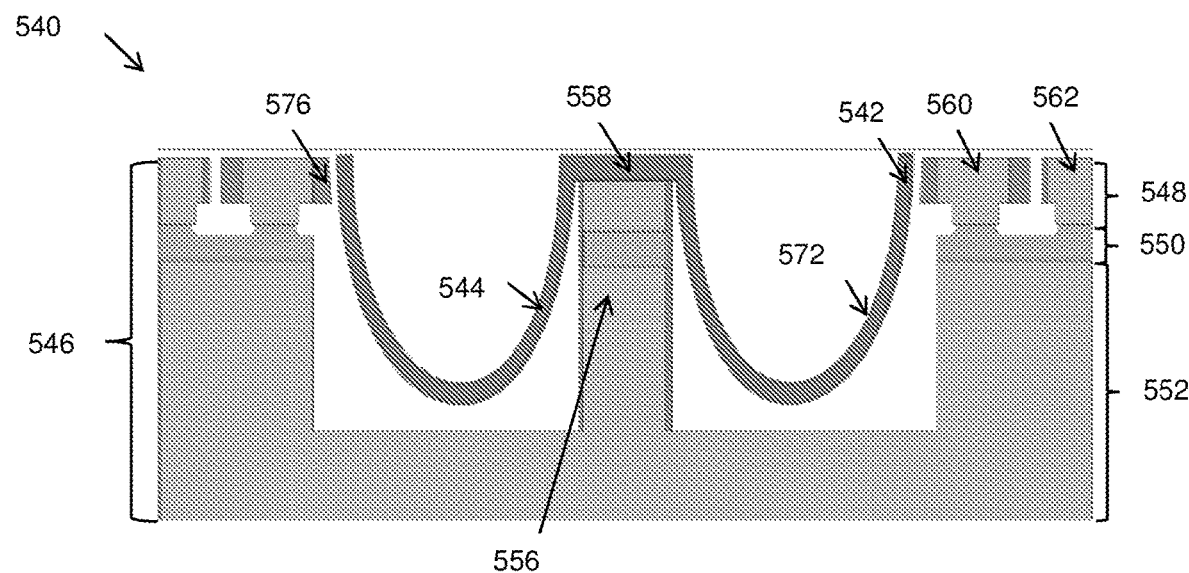

FIGS. 5A-5D are cross-sectional views illustrating exemplary process steps, similar to those illustrated in FIGS. 4A-4D, for fabricating another exemplary high-performance vibratory gyroscope, wherein the rim of the micro-shell faces away from the electrode substrate. FIG. 5A shows the forming of the micro-shell resonator on the electrode substrate and the patterning of a seed layer on the electrode substrate. FIG. 5B shows the coating of the micro-shell resonator with the sacrificial layer. FIG. 5C shows the growth of the seed layers to fill the gaps between the micro-shell resonator and the discrete electrodes. FIG. 5D shows the release of the micro-shell resonator.

Figure 6A:
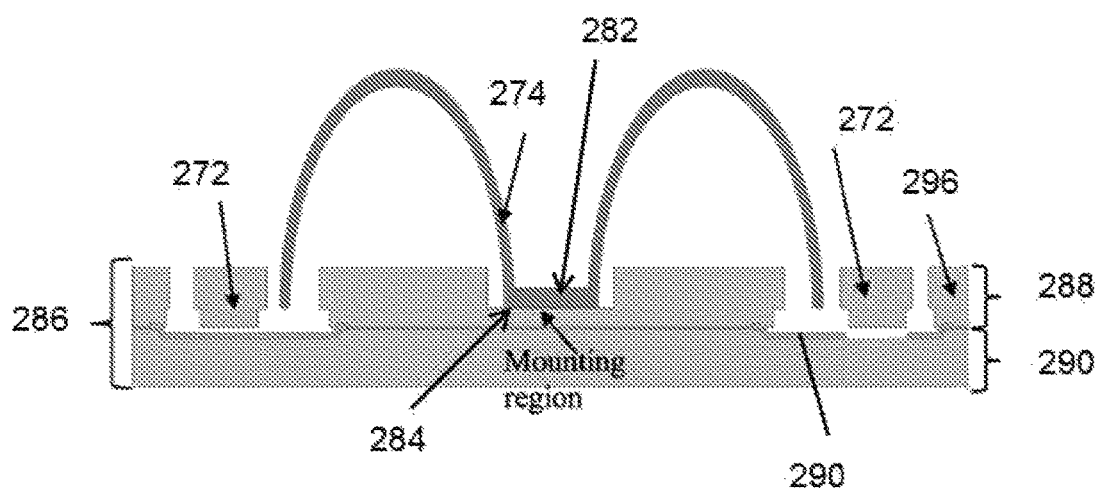
Figure 6B:
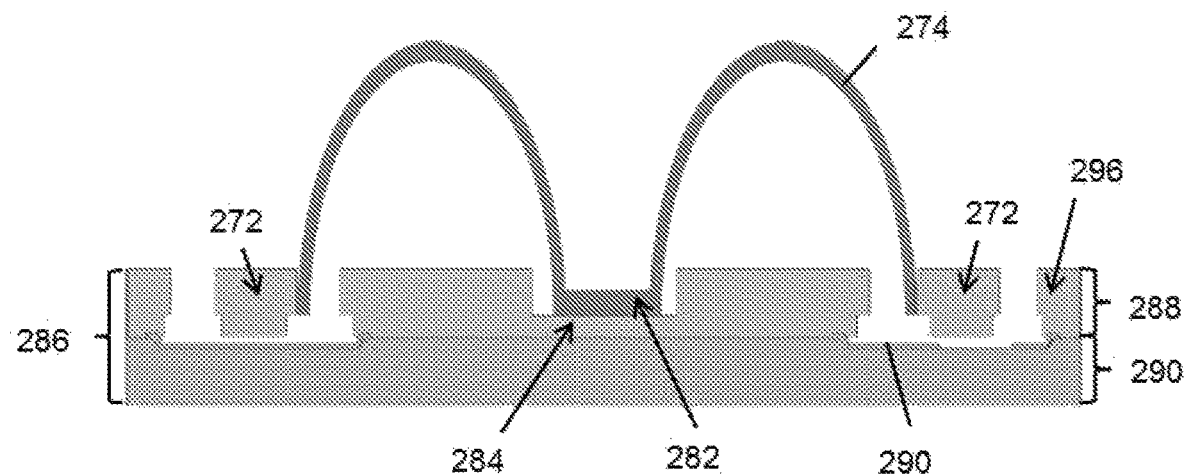
Figure 6C:
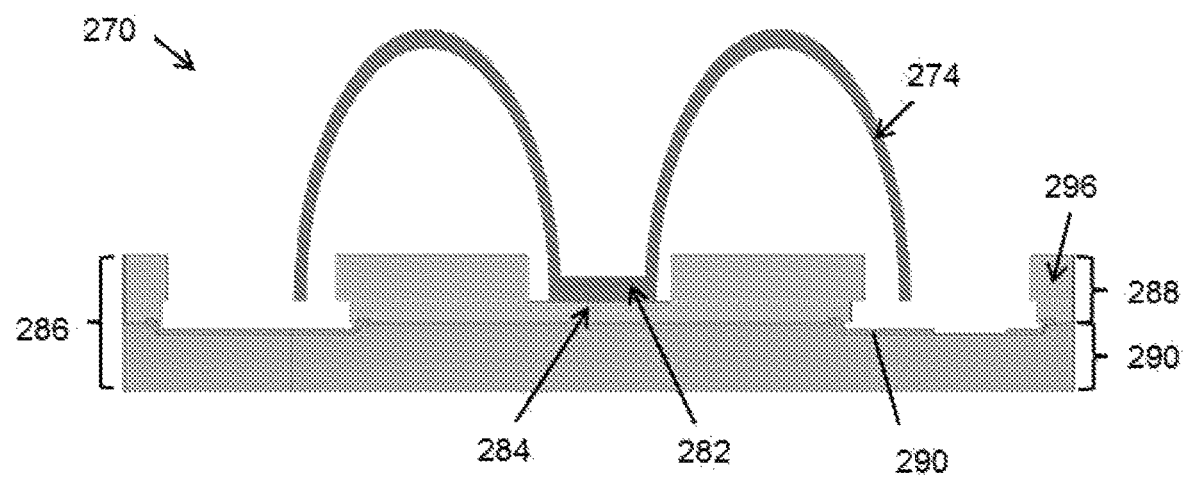

FIGS. 6A-6C are cross-sectional views illustrating exemplary process steps for fabricating another exemplary high-performance vibratory gyroscope using a movable jig similar to the method illustrated in FIGS. 1A-1U. FIG. 6A shows the bonding of the micro-shell resonator to the electrode substrate. FIG. 6B shows the movement of the movable jigs to align the micro-shell resonator with respect to the center of the electrode substrate. FIG. 6C shows the release of the movable jigs and thereby the release of the micro-shell resonator.

Figure 7A:
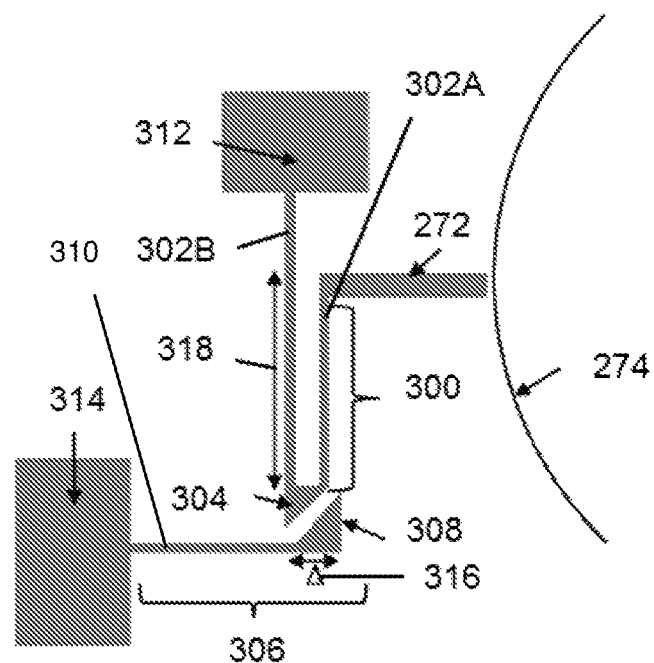
Figure 7B:
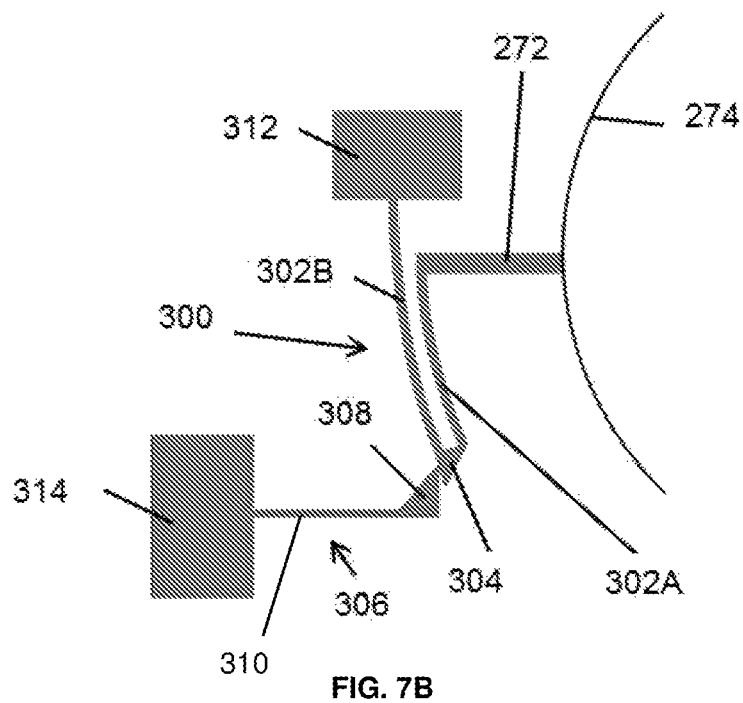

FIGS. 7A-7B are top-down views of the movable jig and latch mechanism described in FIGS. 6A-6C. FIG. 7A shows the movable jig and latch mechanism before the movable jig is pushed towards the micro-shell resonator. FIG. 7B shows the movable jig and latch mechanism after the movable jig has been locked in position by the latch.

Figure 8A:
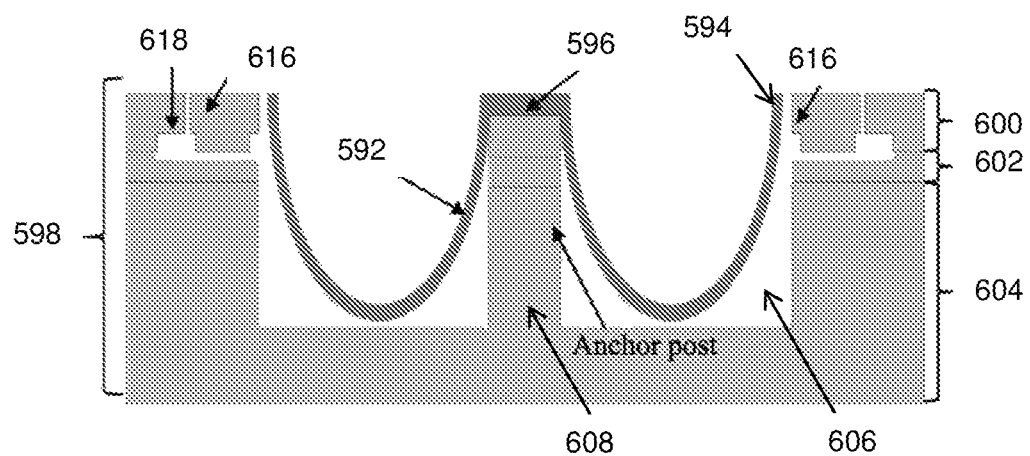
Figure 8B:
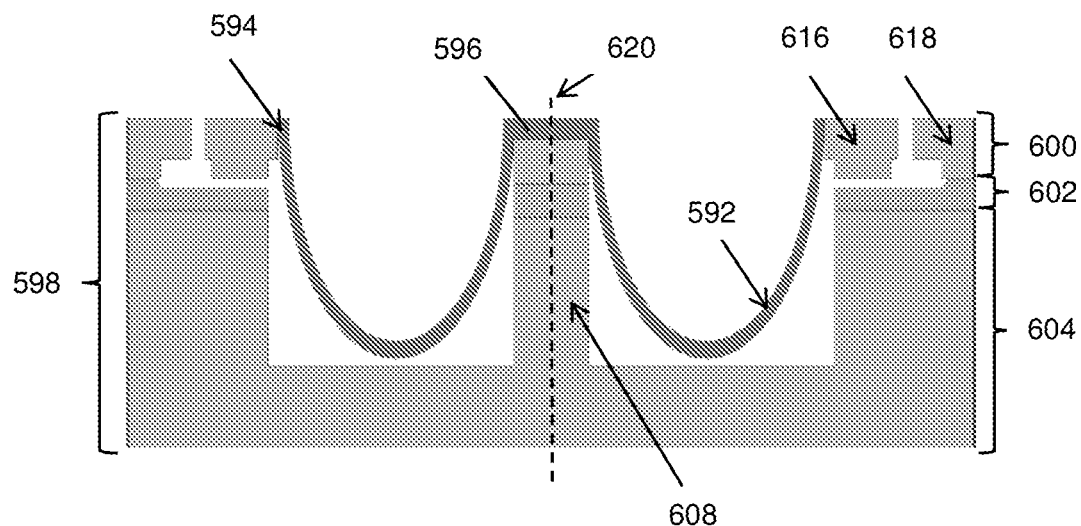
Figure 8C:
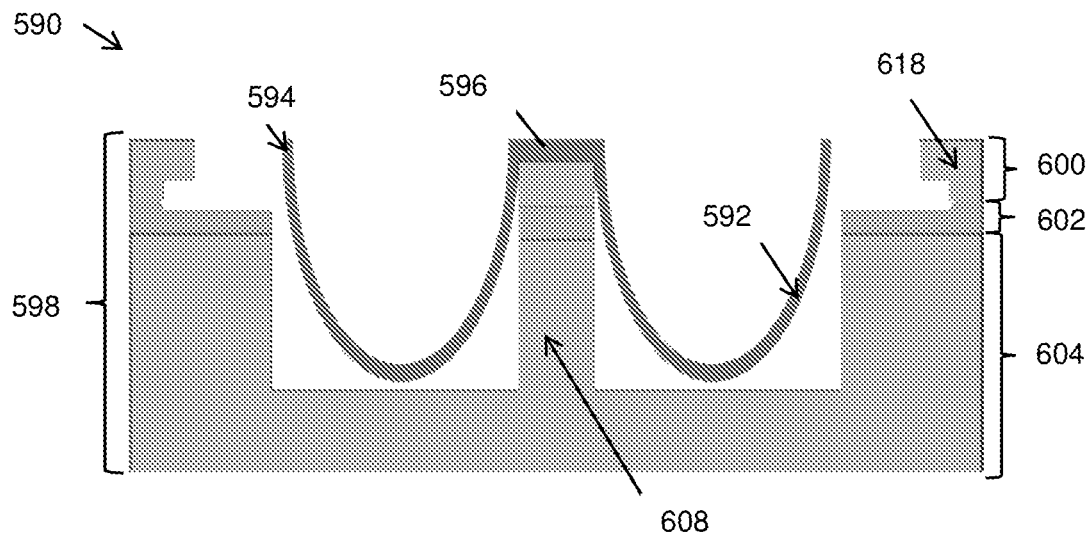
Figure 8D:
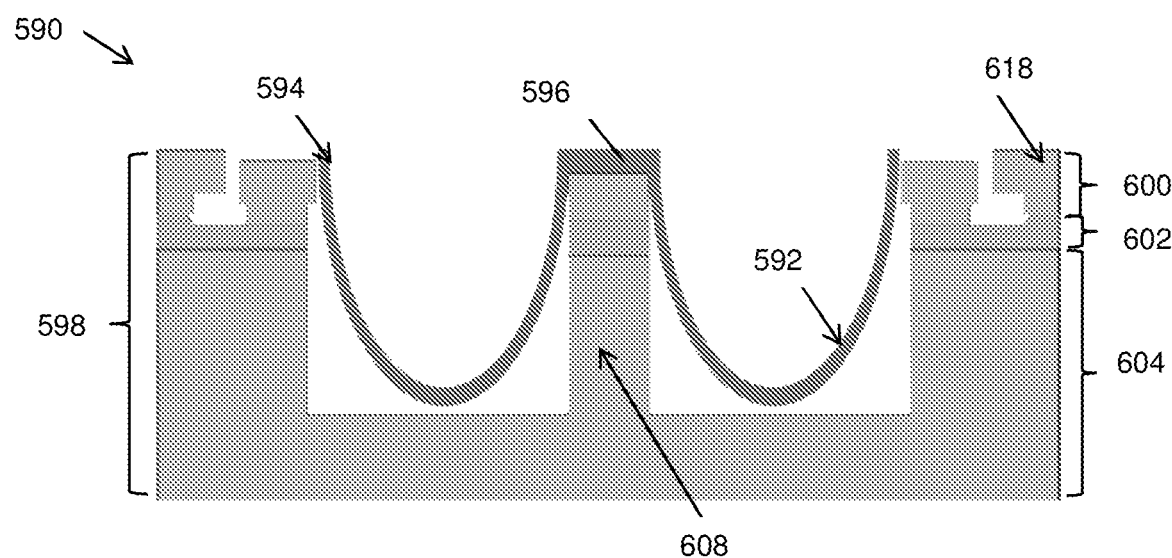

FIG. 8A-8D are cross-sectional views illustrating exemplary process steps, similar to those illustrated in FIGS. 6A-6C, for fabricating another exemplary high-performance vibratory gyroscope, wherein the rim of the micro-shell faces away from the electrode substrate. FIG. 8A shows the forming of the micro-shell resonator on the electrode substrate. FIG. 8B shows the movement of the movable jigs to align the micro-shell resonator with respect to the center of the electrode substrate. FIG. 8C shows the release movable jig and, consequently, the release of the micro-shell resonator. FIG. 8D shows the bonding of the movable jig and the middle substrate and, consequently, the release of the micro-shell resonator.

Figure 9A:
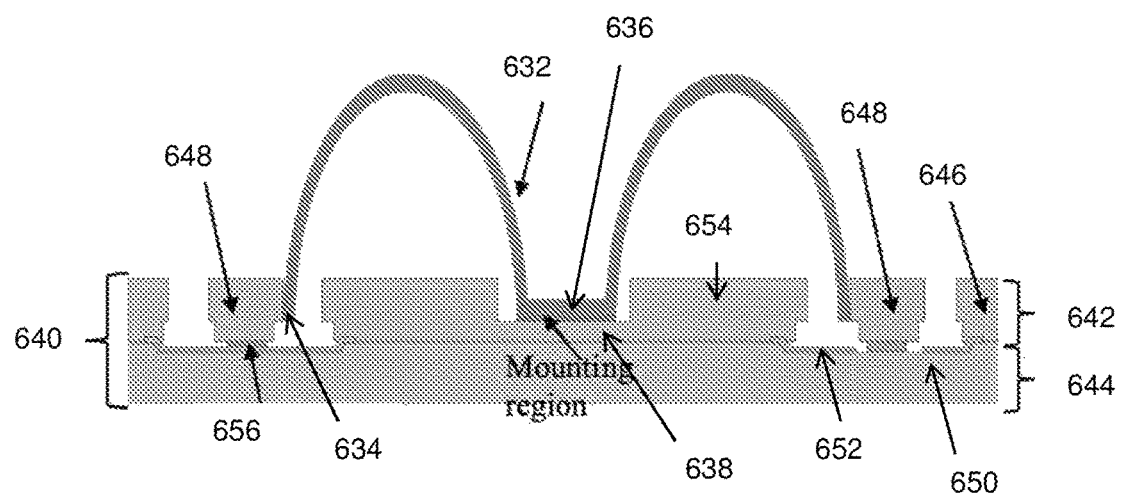
Figure 9B:
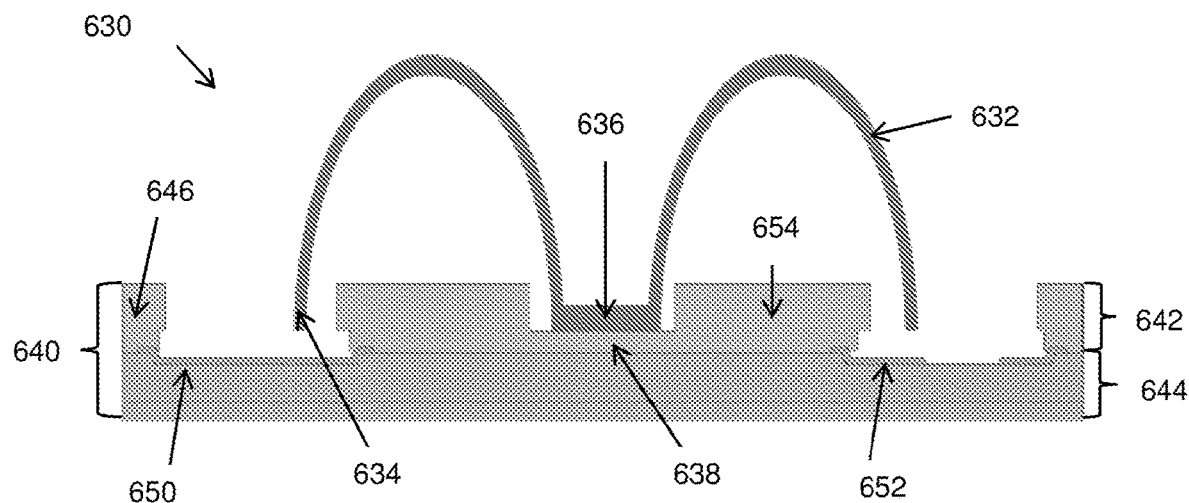

FIGS. 9A-9B are cross-sectional views illustrating exemplary process steps, similar to those illustrated in FIGS. 6A-6C, for fabricating another exemplary high-performance vibratory gyroscope, wherein the jig is fixed to the bottom substrate. FIG. 9A shows the forming of the micro-shell resonator on the electrode substrate. FIG. 9B shows the release of the fixed jig and, consequently, the release of the micro-shell resonator.

Figure 10A:
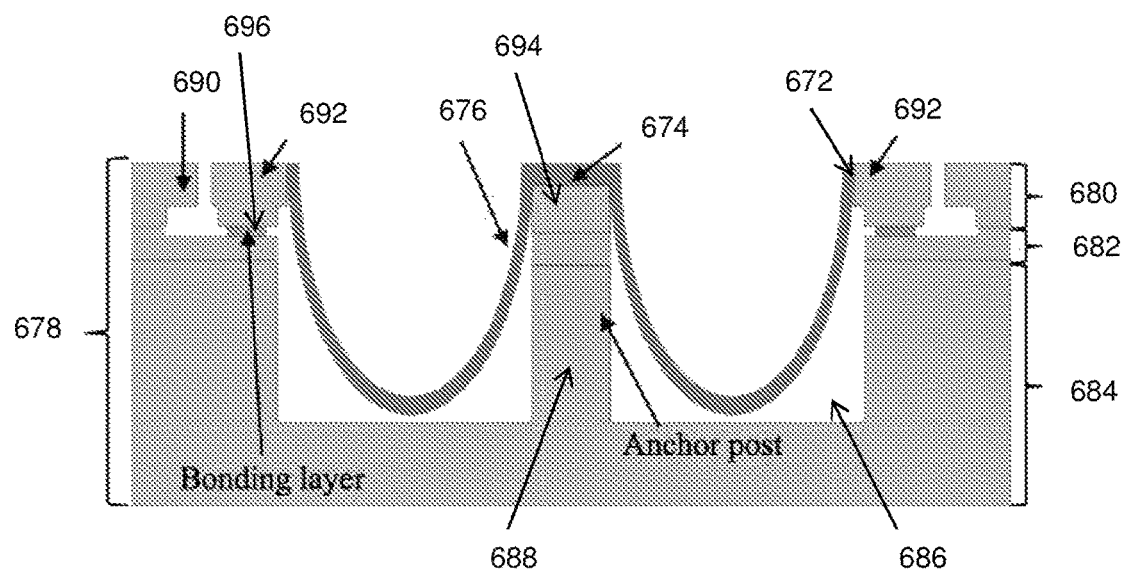
Figure 10B:
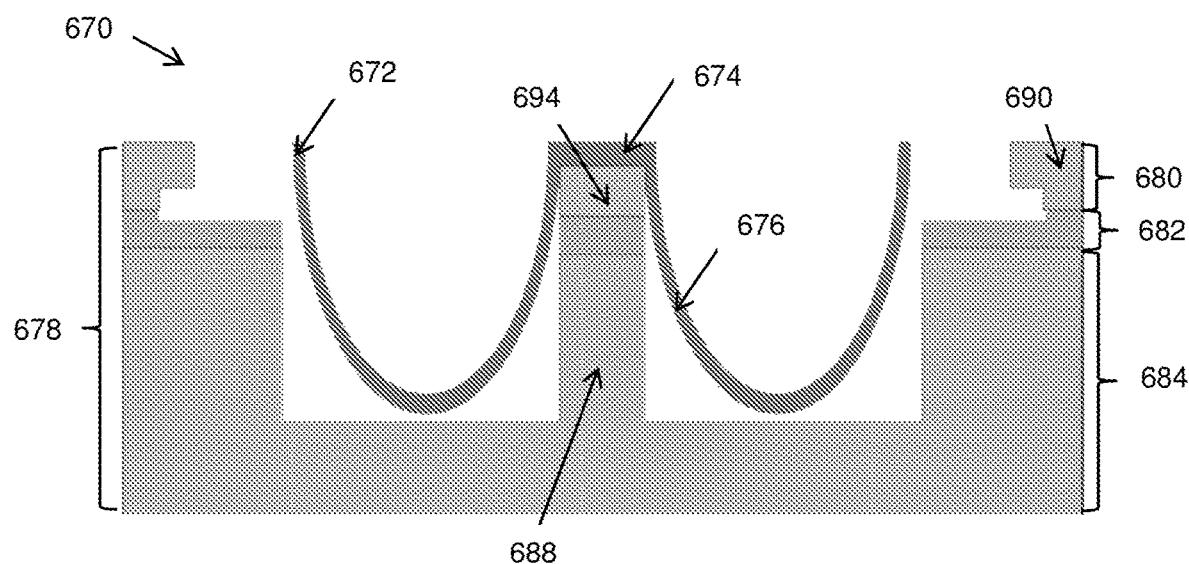

FIGS. 10A-10B are cross-sectional views illustrating exemplary process steps, similar to those illustrated in FIGS. 9A-9C, for fabricating another exemplary high-performance vibratory gyroscope, wherein the rim of the micro-shell faces away from the electrode substrate. FIG. 10A shows the forming of the micro-shell resonator on the electrode substrate. FIG. 10B shows the release of the fixed jig and, consequently, the release of the micro-shell resonator.

Figure 11A:
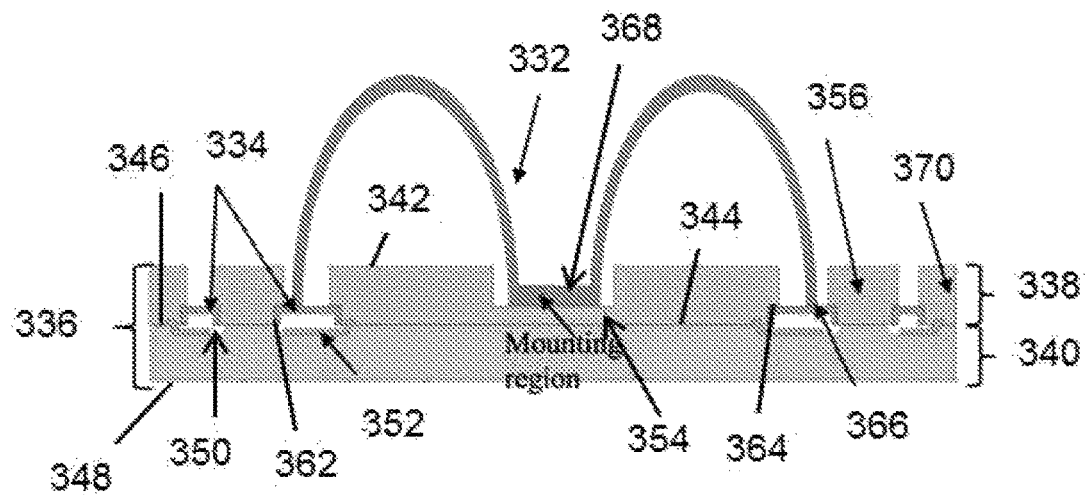
Figure 11B:
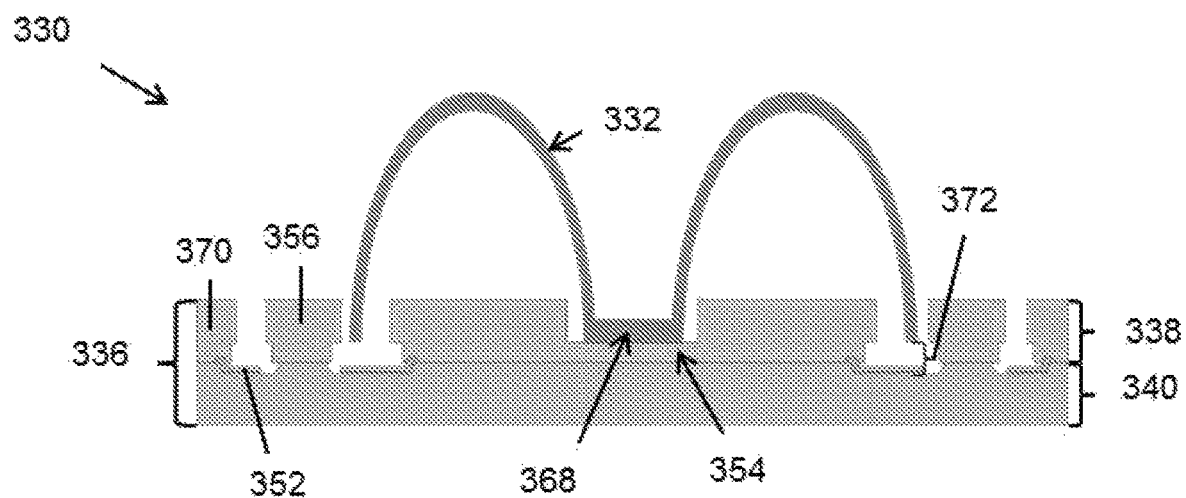

FIGS. 11A-11B are cross-sectional views illustrating exemplary process steps for fabricating another exemplary high-performance vibratory gyroscope using a leveling layer similar to the method illustrated in FIGS. 1A-1U. FIG. 11A shows the forming of the micro-shell resonator on the electrode substrate, wherein the micro-shell resonator is supported by the leveling layer. FIG. 11B shows the removal of the leveling layer and the release of the micro-shell resonator.

Figure 12A:
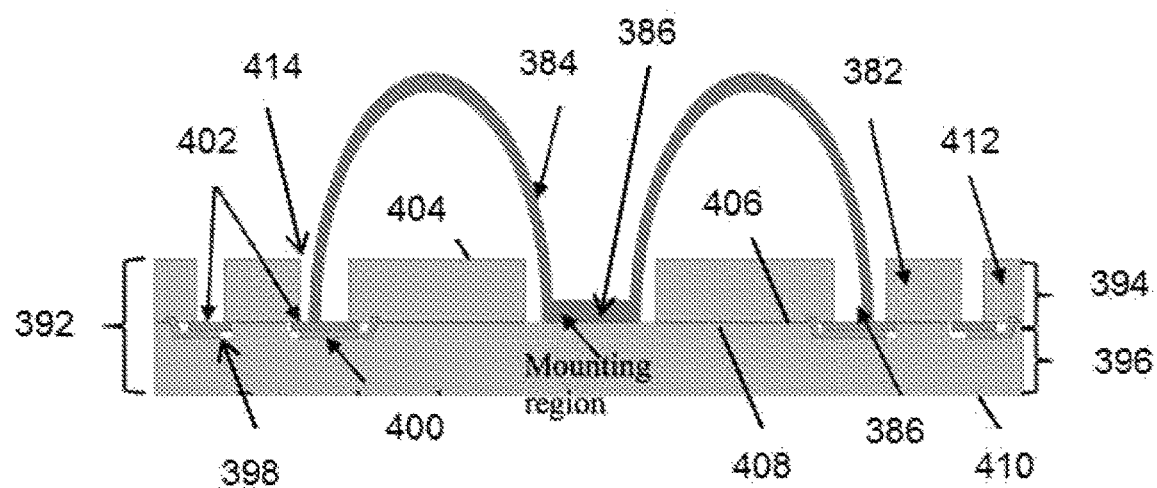
Figure 12B:
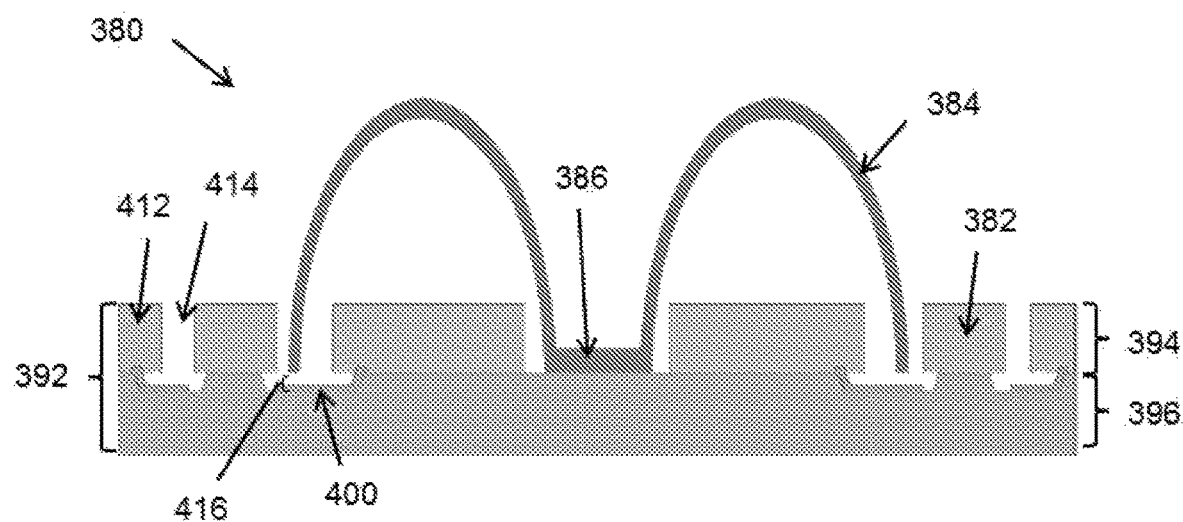

FIGS. 12A-12B are cross-sectional views illustrating exemplary process steps, similar to those illustrated in FIGS. 11A-11B, for fabricating another exemplary high-performance vibratory gyroscope, wherein the leveling layer is substantially parallel with a second surface of the second substrate. FIG. 12A shows the forming of the micro-shell resonator on the electrode substrate, wherein the micro-shell resonator is supported by the leveling layer. FIG. 12B shows the removal of the leveling layer and the release of the micro-shell resonator.

Figure 13A:
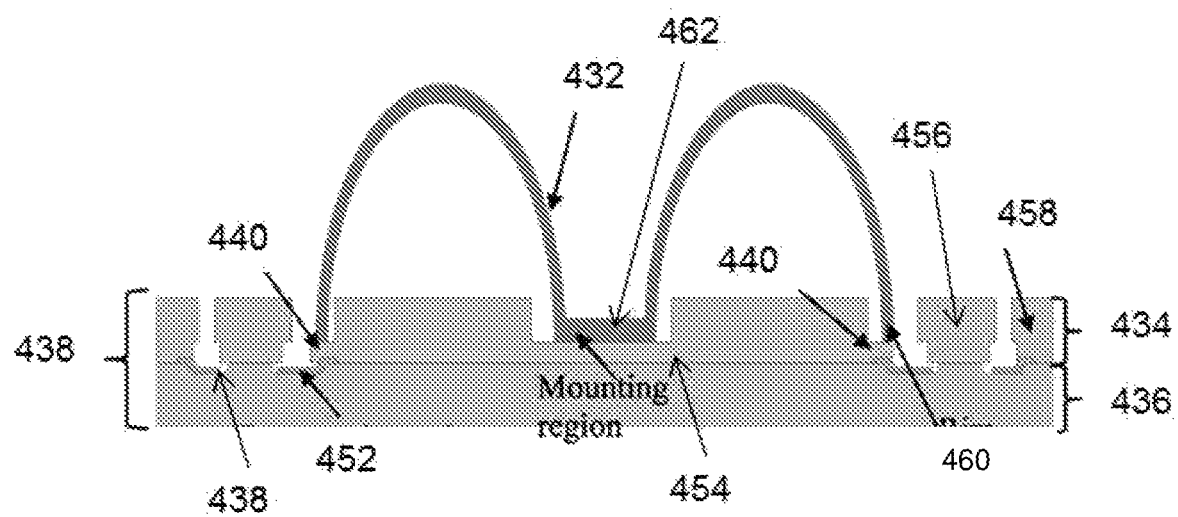
Figure 13B:
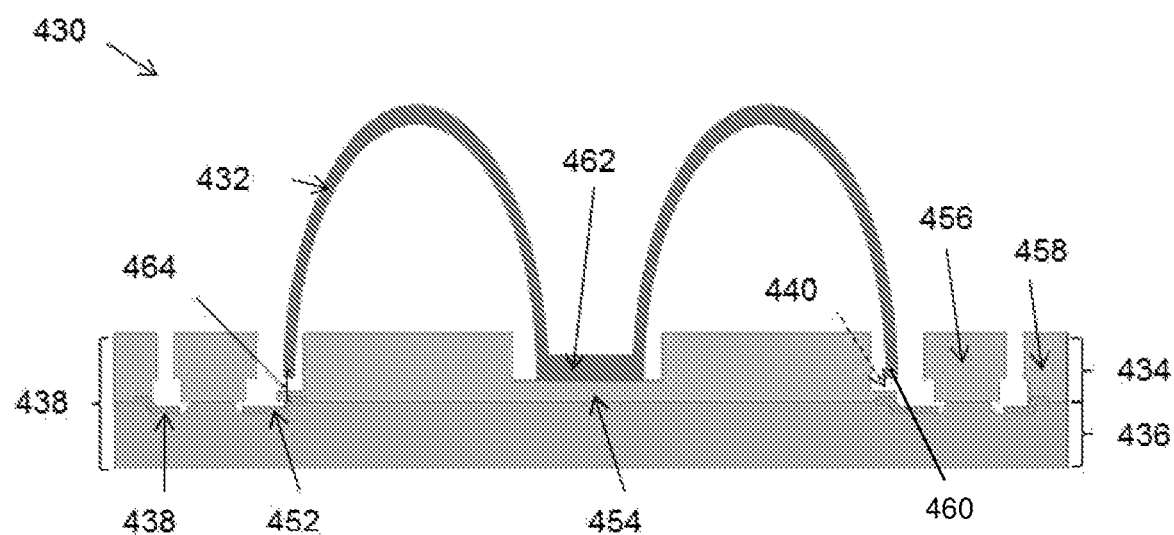

FIGS. 13A-13B are cross-sectional views illustrating exemplary process steps, similar to those illustrated in FIGS. 11A-11B, for fabricating another exemplary high-performance vibratory gyroscope, wherein an leveling layer is etched into the top substrate. FIG. 13A shows the forming of the micro-shell resonator on the electrode substrate, wherein the micro-shell resonator is supported by a step formed in the top substrate. FIG. 13B shows the etching of the step and the release of the micro-shell resonator.

Figure 14A:
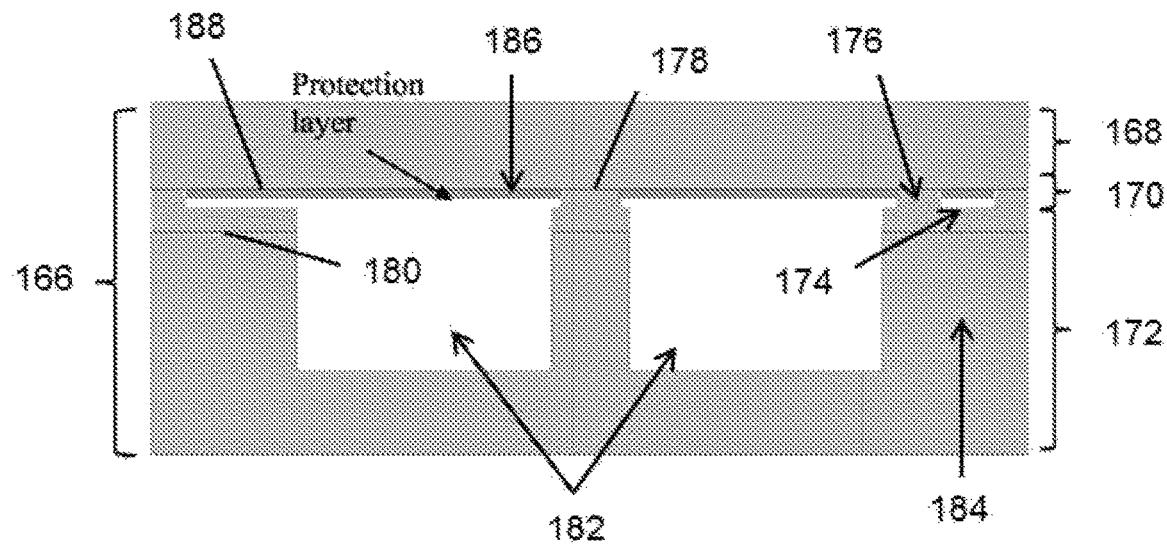
Figure 14B:
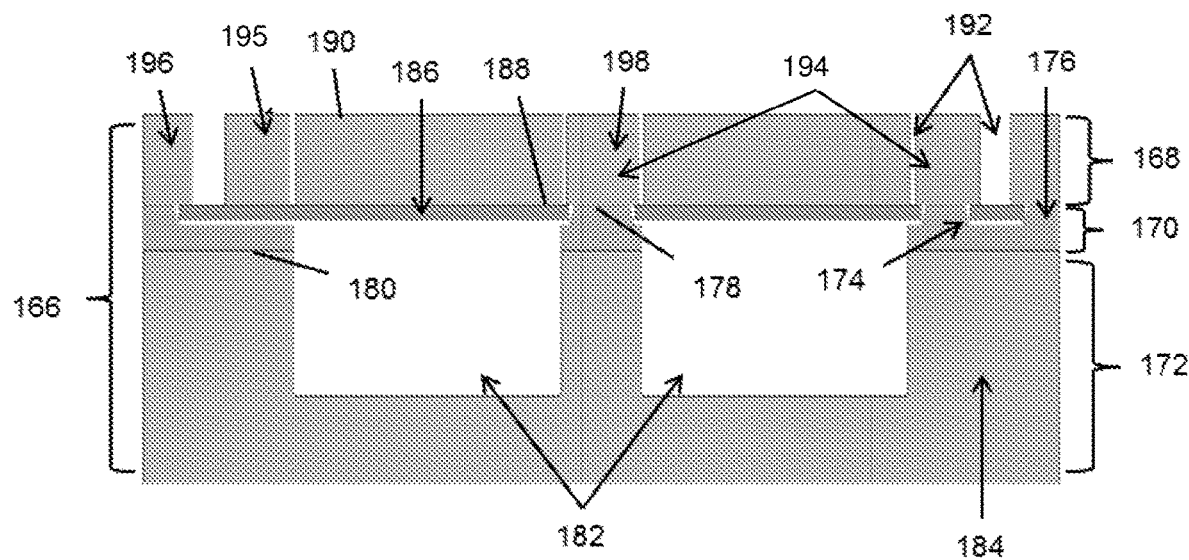
Figure 14C:
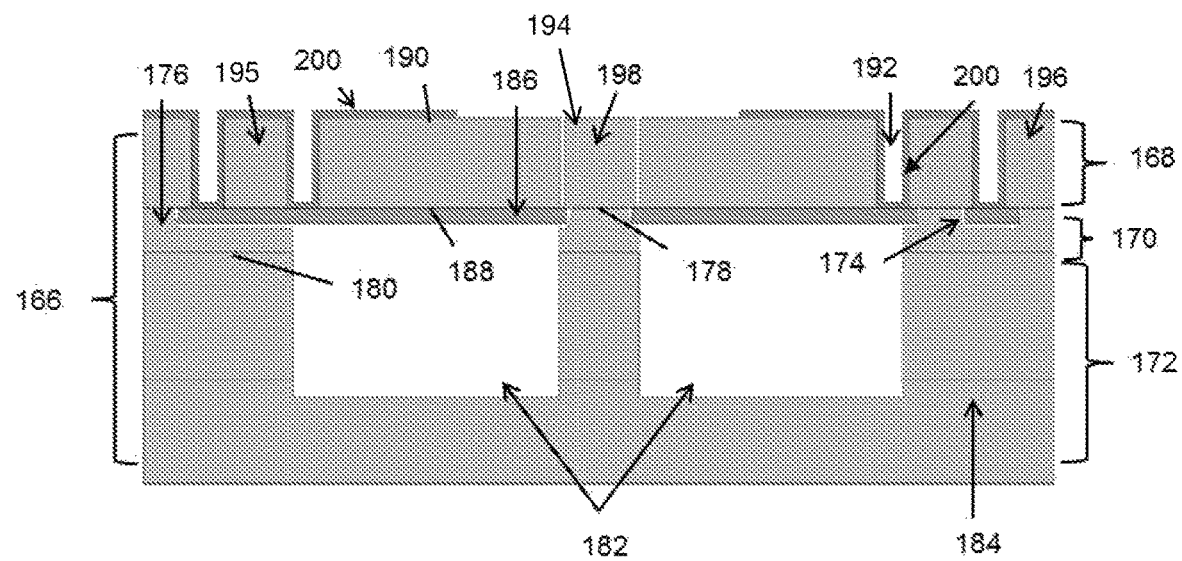
Figure 14D:
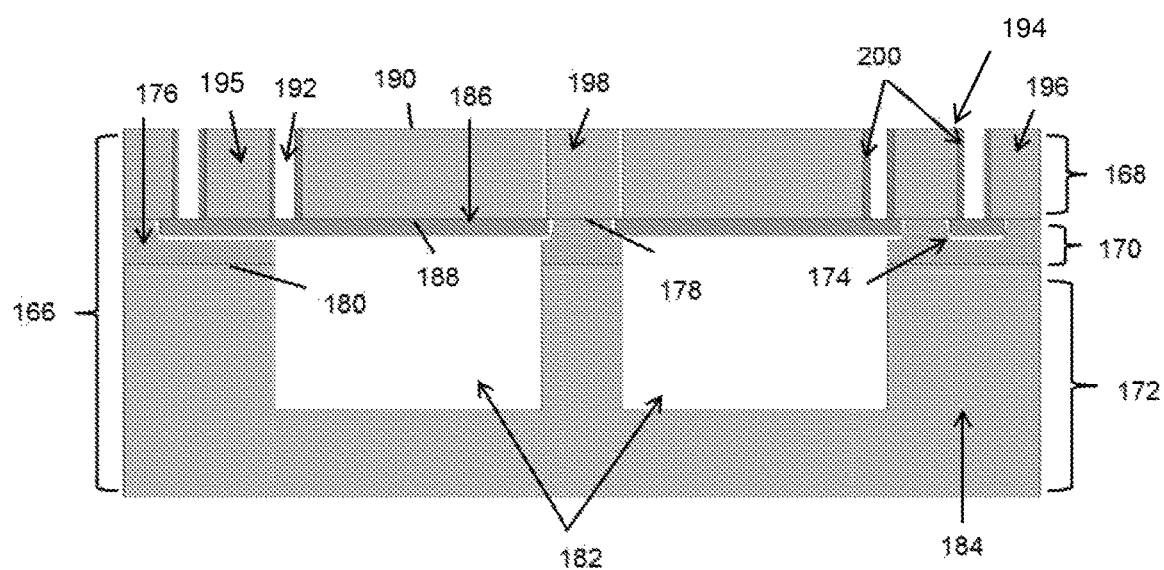
Figure 14E:
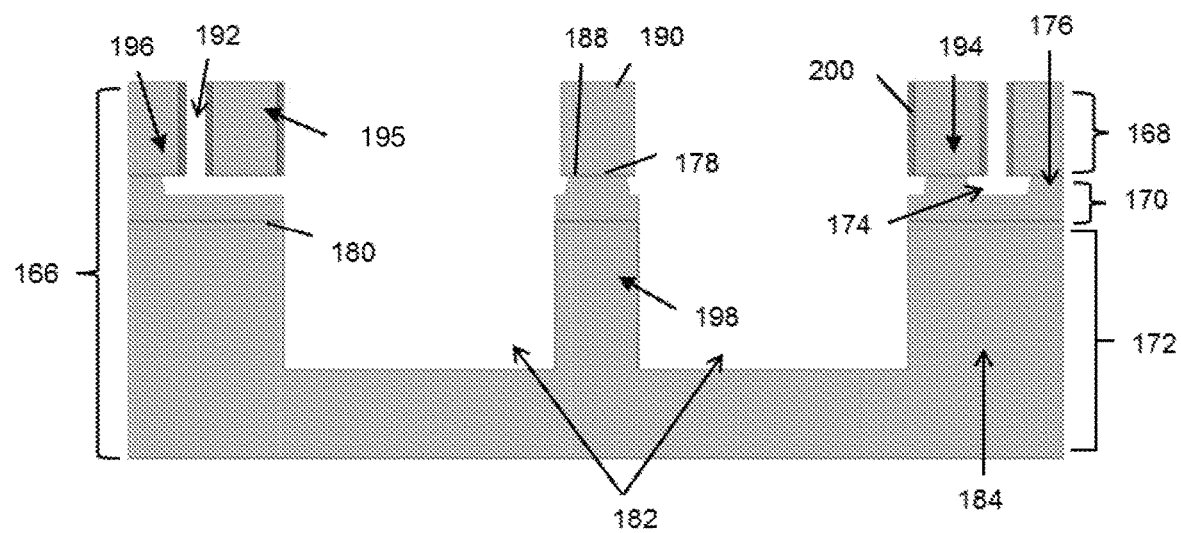
Figure 14F:
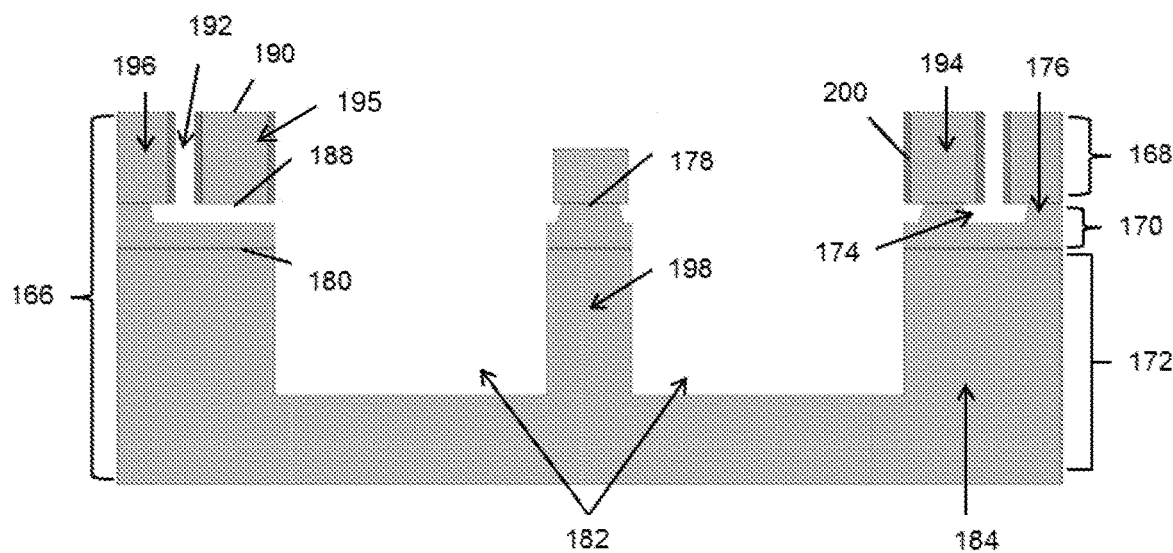
Figure 14G:
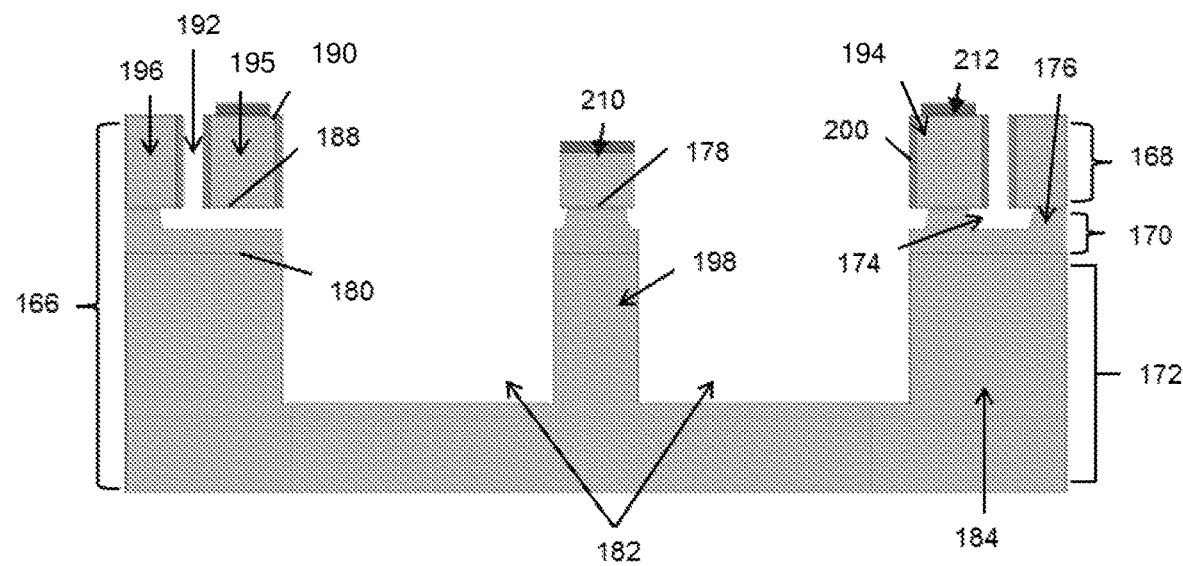
Figure 14H:
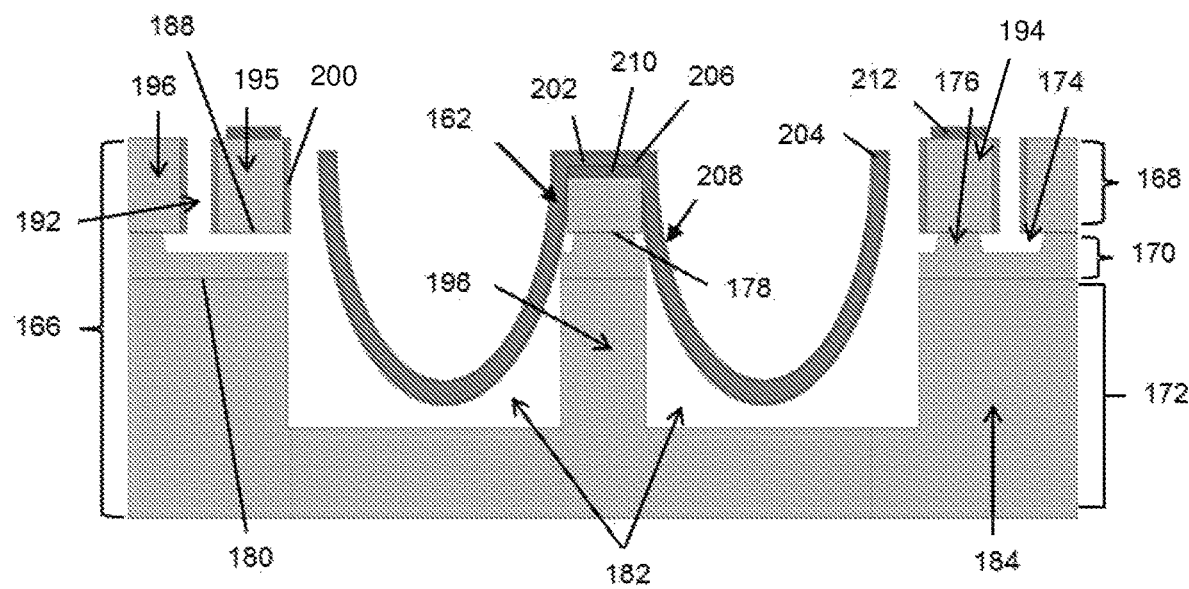
Figure 14I:
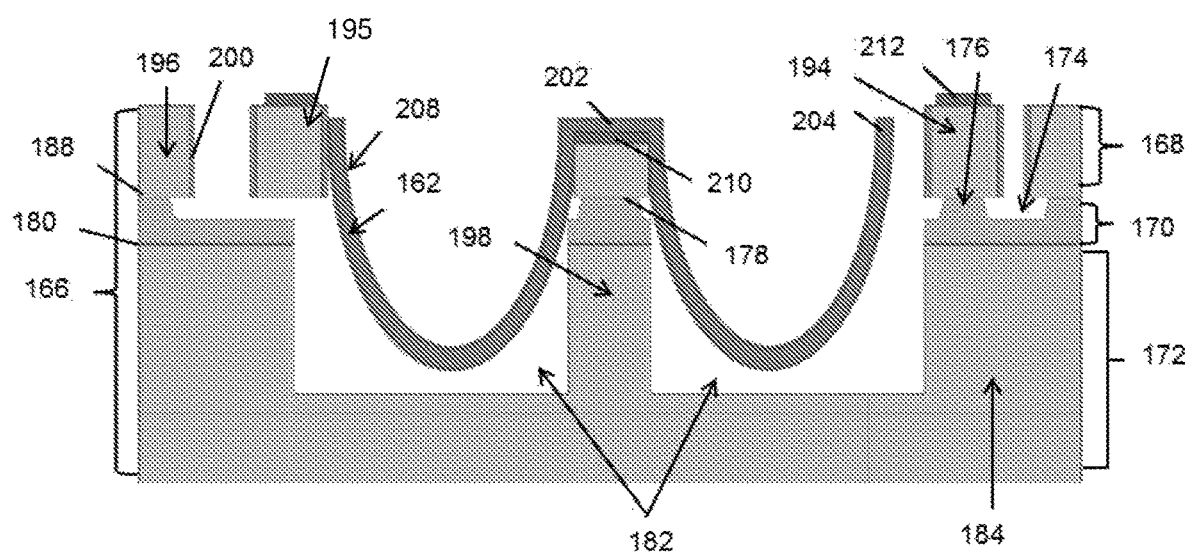
Figure 14J:
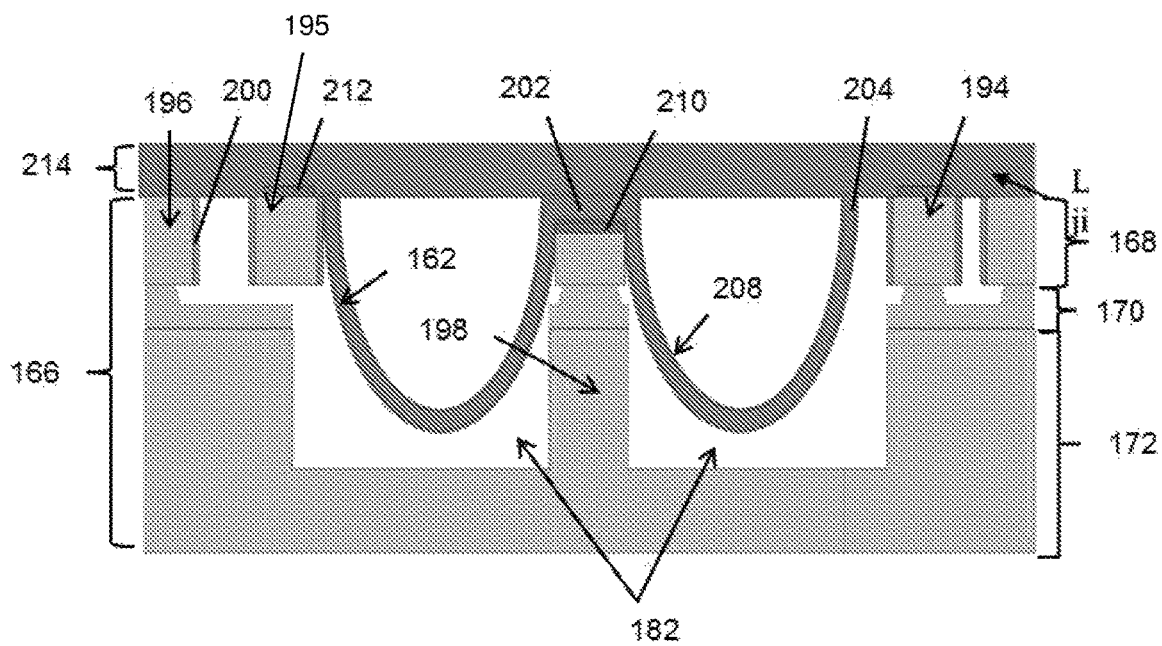
Figure 14K:
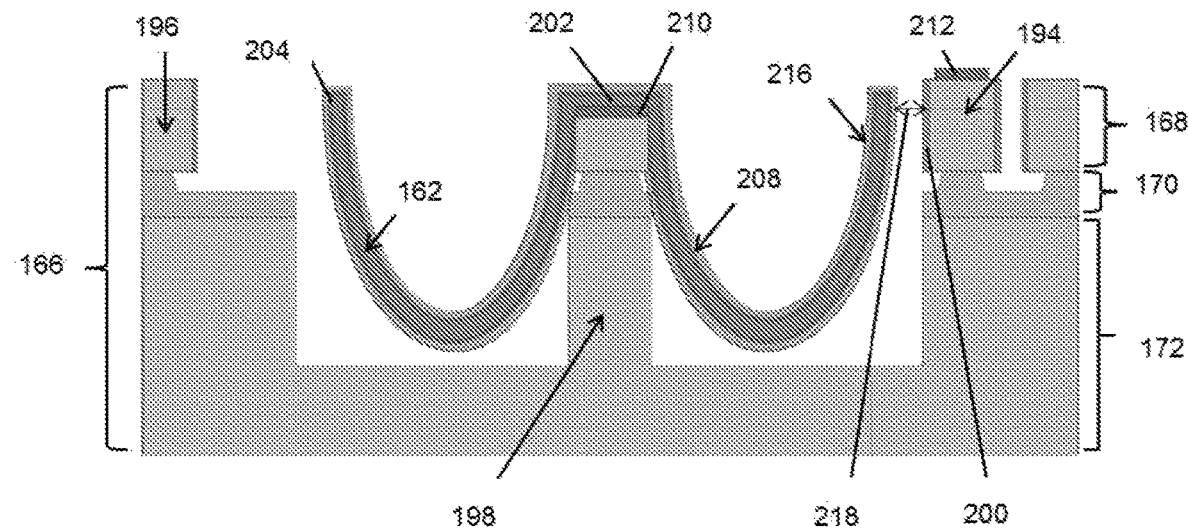
Figure 14L:
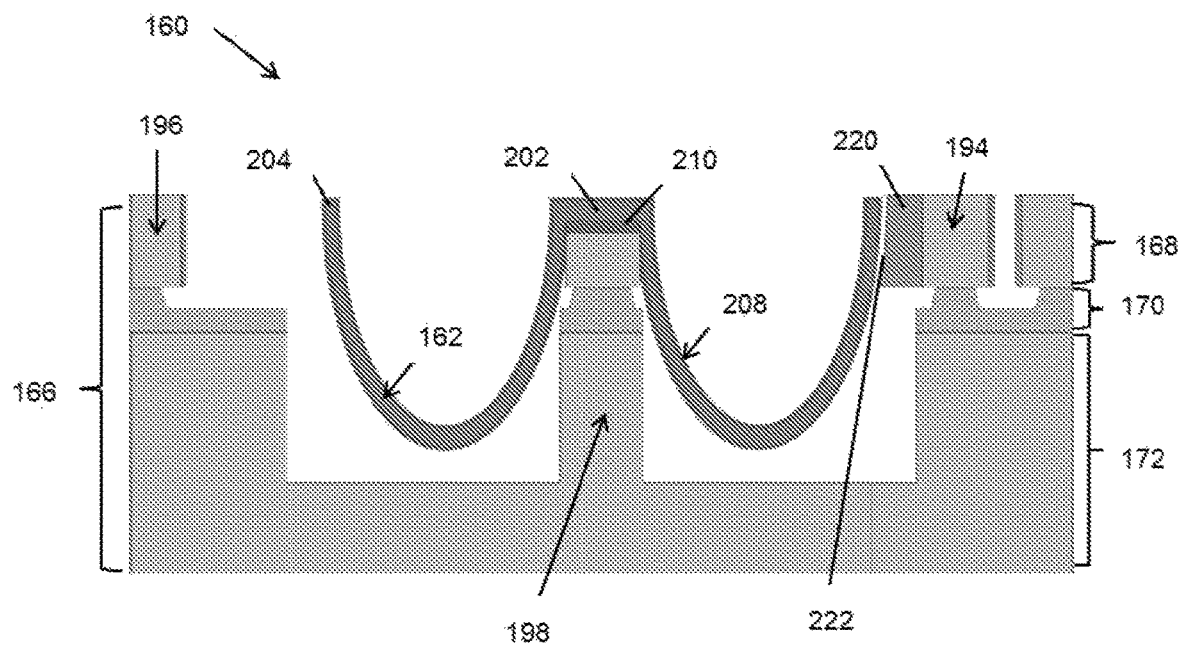

FIGS. 14A-14L are cross-sectional views illustrating exemplary process steps, similar to those illustrated in FIGS. 1A-1U, for fabricating another exemplary high-performance vibratory gyroscope, wherein the rim of the micro-shell resonator faces away from the electrode substrate comprising first and second substrates and a third substrate sandwiched therebetween. FIG. 14A shows the electrode substrate. FIG. 14B shows the patterning of the first substrate. FIG. 14C shows the depositing of a seed layer onto the surfaces of the first substrate. FIG. 14D shows the patterning of the seed layer. FIG. 14E shows the dissolution of the protective layer and the suspension of the movable jig. FIG. 14F shows the recess of the anchor post. FIG. 14G shows the deposition of the contact pads and the bonding layers. FIG. 14H shows the alignment of the micro-shell resonator and the electrode substrate. FIG. 14I shows the use of the movable jig to move the micro-shell resonator. FIG. 14J shows the bonding of the micro-shell resonator to the post using a leveling jig. FIG. 14K shows the deposition of a sacrificial layer onto the micro-shell resonator. FIG. 14L shows the growth of the seed layers to fill to fill the gaps between the micro-shell resonator and the discrete electrodes and the removal of the sacrificial layer.

Corresponding reference numerals indicate corresponding parts throughout the several views of the drawings.

DETAILED DESCRIPTION

Example embodiments will now be described more fully with reference to the accompanying drawings.

FIGS. 1A-1U illustrate a method for fabricating an exemplary high-performance vibratory gyroscope 19 having substantially perfect alignment and leveling of an micro-shell resonator 54 with respect to an electrode substrate 20, and substantially uniform gaps 116 between the micro-shell resonator 54 and the discrete electrodes 34 that surround the micro-shell resonator 54. In particular, FIGS. 1A-1U illustrate a microfabrication process for fabricating an exemplary high-performance vibratory gyroscope 19 comprising a micro-shell resonator 54 anchored to an electrode substrate 20 using a leveling layer 58, a movable jig 35, and a sacrificial layer 90, wherein a rim 52 of the micro-shell resonator 54 faces the electrode substrate 20. While reference is made throughout this disclosure to gyroscopes (e.g., 19) and micro-shell resonators (e.g., 54), it is understood that the fabrication techniques described herein may be used to construct other three-dimensional ("3D") microstructures.

In FIG. 1A, a first surface 30 of a first substrate (e.g., bottom substrate) 24 is patterned to form a first plurality of recesses 42. The bottom substrate 24 is an electrically insulating substrate and may comprise borosilicate glass, aluminosilicate glass, ultra-low expansion glass, fused silica, sapphire, ruby, silicon carbide, quartz, alumina, semiconductor coated with an insulating material (e.g. silicon wafer coated with silicon dioxide), conductor material coated with an insulating material (e.g. aluminum coated with aluminum oxide, titanium coated with titanium oxide), or combinations thereof. The bottom substrate 24 may be patterned using either dry or wet etching techniques. A plurality of first electrodes (e.g., bottom electrodes) 44 are deposited substantially within selected recesses 42 of the bottom substrate 24. The bottom electrodes 44 are used to form electrical connections between selected discrete electrodes 34 (see FIG. 1G). The bottom electrodes 44 are patterned to facilitate the desired electrical connections. In the illustrated example, the bottom electrodes 44 do not fill the selected recesses 42, but instead hangover one edge 64 of each recess 42. The bottom electrodes 44 hangover the edge of the bottom recesses 42 to allow for the creation of physical connections with the discrete electrodes 34 (see FIG. 1G). It is understood that in other instances, the recesses 42 and the bottom electrodes 44 may take other shapes and forms.

In FIG. 1B, a first surface 26 of a second substrate (e.g., top substrate) 22 is patterned to form a second plurality of recesses 66. The top substrate 22 is an electrically conducting substrate and may comprise an electrical conductor, a semiconductor, or an electrical insulator having a surface coated with a thin electrical conductor. The top substrate 22 may be patterned using either dry or wet etching techniques.

After the top substrate 22 is patterning, a first layer 50 is deposited on the first surface 26 of the top substrate 22 and within the recesses 66 (e.g., coats the recesses) of the top substrate 22, as seen in FIG. 1C. The first layer 50 may comprise a metal, a polymer, a semiconductor, dielectric material, or a combination thereof. For example only, the metal may be selected from the group consisting of: gold, silver, platinum chrome, aluminum platinum, iridium, copper, iron, titanium, nickel, cobalt, indium, tin, cadmium, tungsten, rubidium, molybdenum, palladium, zinc, rhodium, germanium, lead, and combinations thereof. For example only, the polymer may be selected from the group consisting of: polyimide, photoresist, Waferbond CR200, crystalbond, shellac, and combinations thereof. For example only, the semiconductor may be selected from the group consisting of: silicon, gallium arsenide, gallium phosphide, indium arsenide, silicon germanium, zinc oxide, and combinations thereof. The dielectric material may be selected from the group consisting of: alumina, titanium oxide, chrome oxide, silicon dioxide, silicon nitride, glass, fused silica, and combinations thereof.

Next, as seen in FIG. 1D, the deposited first layer 50 is patterned to form a plurality of leveling layers 58 and a bonding layer (not shown) (see, e.g., FIG. 9A) to level and support the bonded microstructure 54 (see FIG. 1L). The first layer 50 may be patterned using either dry or wet etching techniques.

Next, as seen in FIG. 1E, the top and bottom substrates 22, 24 are aligned to form the electrode substrate 20. The first surface 26 of the top substrate 22 is aligned opposite the first surface 30 of the bottom substrate 24. The top and bottom substrates 22, 24 are substantially parallel and the recesses 66 of the top substrate 22 align substantially with the recesses 42 of the bottom substrate 24.

After the top and bottom substrates 22, 24 are aligned, a plurality of vertical feedthroughs 68 are defined on the bottom substrate 24, as seen in FIG. 1F. Feedthroughs 68 allow for the formation of electrical connections to the discrete electrodes 34 (see FIG. 1G). Feedthroughs 68 may be made for each discrete electrode 34 (see FIG. 1G).

Next, as seen in FIG. 1G, a second surface 28 of the top substrate 22 is patterned to expose the leveling layers 58 and to form a plurality of discrete electrodes 34, a plurality of movable jigs 35, a boundary 36, and a mounting region 62. The discrete electrodes 34 are anchored to the bottom substrate 24, while the movable jigs 35 are suspended from the bottom substrate 24.

In particular, the second surface 28 of the top substrate 22 is etched a form a plurality of recesses 70 that correspond substantially with recesses 66 patterned on the first surface 26 of the top substrate 22 (see FIG. 1B). Recesses 66 have a width 74 that is larger than the width 76 of recesses 70 forming a plurality of vertical and lateral surfaces 46, 48. In the illustrated example, the leveling layers 58 are attached to and protected by the vertical and lateral surfaces 46, 48. However, in other instances (not shown), the leveling layer may be attached to the bottom substrate 24.

As illustrated in FIG. 1H, a seed layer 78 is deposited on the second surface 28 of the top substrate 22. The seed layer 78 also coats the mounting region 62, recesses 70, and regions of the first surface 30 of the bottom substrate 24 not shield by one of the pluralities of leveling layers 58. For example only, the seed layer 78 may comprise titanium, gold, platinum, chromium, titanium-platinum, chromium-platinum, chromium-gold, a carbon nanotube, a semiconductor (e.g., zinc oxide, gallium arsenide), or combinations thereof. The seed layer 78 may be deposited using sputtering, low pressure chemical vapor deposition ("LPCVD"), plasma enhanced chemical vapor deposition ("PECVD"), or atomic layer deposition ("ALD"). The seed layer 78 has a high electrical conductivity, which will allow conductors to be subsequently deposited (see FIG. 1S).

While reference is made throughout this disclosure to the use of seed layers (e.g., 78), it is understood that, in certain instances, the fabrication techniques described herein are applicable to processes and systems that may not use seed layers. For example, seed layers may not be required in instances wherein growth occurs using chemical vapor deposition ("CVD"), or instances wherein the discrete electrodes 34 have high conductivity.

Next, as illustrated in FIG. 1I, the seed layer 78 is etched away from all lateral (e.g., horizontal) surfaces to form a plurality of seed layers 78, and a bonding layer 80 is deposited on the mounting region, including the sidewalls 84 and edges that form the mounting region. The bonding layer 80 may comprise metal solders, glass frit, metal diffusion pastes, or a thick metal layer for thermal compression bonding. A plurality of contact pads 82 are deposited on select discrete electrodes 34 and the movable jig 35. Contact pads 82 may be deposited onto all discrete electrodes 34 from which an electrical signal is to be read. For example only, the contact pads 82 may comprise titanium-platinum, titanium-gold, chromium-platinum, chromium-gold, or combinations thereof.

In FIG. 1J, a thin electrical conductor layer 86 is deposited on the surfaces of the micro-shell resonator 54. For example only, the thin electrical conductor layer 86 may comprise titanium-platinum, titanium-gold, chromium-platinum, chromium-gold, titanium-iridium, chromium-iridium, or combinations thereof. The micro-shell resonator 54 forms a hollow half toroid (e.g., birdbath) and has a rim 52 and an anchor 56. In certain instances, the micro-shell resonator 54 can be formed using methods described in U.S. patent application Ser. No. 13/481,650, filed May 25, 2012, titled "Gyroscope and Method of Fabricating a Resonator for a Gyroscope," which is herein incorporated by reference in its entirety. In other instances, the micro-shell resonator 54 can be formed using methods described in U.S. patent application Ser. No. 14/985,859, filed Dec. 31, 2015, titled "Three Dimensional Microstructures and Fabrication Process," which is also incorporated by referenced in its entirety. The thin electrical conductor layer 86 may be deposited onto the surfaces of the micro-shell resonator 54 using low pressure chemical vapor deposition ("LPCVD"), plasma enhanced chemical vapor deposition ("PECVD"), atomic layer deposition ("ALD"), sputtering, or evaporation techniques. For example only, the micro-shell resonator 54 may be bonded to the electrode substrate 20 using an ultra-high-concentration gold paste, which will allow for low temperature (<200° C.) bonding because of the sintering of the submicron gold particles. Additionally, as seen in FIG. 1K, a bonding layer 88 may in certain instances be deposit on the anchor 56.

As seen in FIG. 1L, the micro-shell resonator 54 is aligned with the electrode substrate 20. The rim 52 of the micro-shell resonator 54 faces the electrode substrate 20. The micro-shell resonator 54 is guided by movable jigs 35 and is leveled by the leveling layer 58. For example, as seen in FIG. 1M, movable jigs 35 surrounding the micro-shell resonator 54 may be pushed towards the center (e.g., anchor) 56 of the micro-shell resonator 54 using a micro manipulator (not shown). The movable jigs 35 touches the sides of the micro-shell resonator 54 and applies a gentle compressive force to align the micro-shell resonator 54 with respect to the discrete electrodes 34. After being pushed a predetermined distance, latch mechanisms (see FIGS. 7A and 7B), coupled to each movable jig 35, may activated to fix the position of the movable jigs 35 allowing for the release of the micromanipulators. The micro-shell resonator 54 is then bonded to the mounting region 62 of the electrode substrate 20 and the movable jig 35 are released as seen in FIG. 1N. The movable jig 35 may be released by etching away a bonding layer (not shown) (see, e.g., FIG. 9A). In other instances, the micro-shell resonator may be formed on the electrode substrate rather than being bonded to or deposited on the electrode substrate (for example only see FIG. 4A-4D).

After the micro-shell resonator 54 is bonded to the electrode substrate 20, the leveling layer 58 is etched away and any remaining jigs (movable jigs 35 or fixed jigs (not shown)) are released, as seen FIG. 1O. In certain instances, the leveling layer 58 may be etched away using either dry or wet etching techniques. In other instances, for example when the leveling layer 58 comprises reflowable material, the leveling layer 58 may be melted away. In still other instances, for example when the leveling layer 58 comprises combustible material, the leveling layer 58 may be burned away.

Next, as seen in FIG. 1P, a substantially uniform (e.g., conformal) sacrificial layer 90 coats the micro-shell resonator 54. The sacrificial layer 90 is deposited on top of the electrical conductor layer 86 (see FIG. 1J). The sacrificial layer 90 is an electroplated photoresist ("EP") layer and may have a thickness ranging between 10 μm and 15 μm.

In FIG. 1Q, the preparation of an electrode connector substrate 92 comprising a substrate 98, a plurality of electrical contact pads 94, and an insulating layer 96 is illustrated. A first surface 100 of the substrate 98 is patterned to form a plurality of step protrusions 102, having a predetermined depth, and throughholes 104. The contact pads 94 are deposited on the protrusions 102 and the insulating layer 96 is deposited on the remaining regions of the first surface 100 of the substrate 98.

As seen in FIG. 1R, the prepared electrode connector substrate 92 is coupled to the electrode substrate 20 using an adhesive 106 that is applied through throughholes 104. Once attached, the electrode connector substrate 92 will apply voltages to the discrete electrodes 34 of the electrode substrate 20 allowing for electroplating of the seed layers 78. Contact pads 94 of the electrode connector substrate 92 make contact with the contact pads 82 of the electrode substrate 20. The protrusions 102 of the electrode connector substrate 92 protect against the formation of electrical lines and electrical shorting between the electrode substrate 20 and the electrode connector substrate 92.

Next, as seen in FIG. 1S, the seed layers 78 (see FIGS. 1H and 1I) are grown (e.g., conductive layer 110 deposited) to fill the gaps 114 (see FIG. 1R) between the micro-shell resonator 54 and the discrete electrodes 34. In the illustrated example, the seed layers 78 are grown using electroplating techniques. In other instances (not shown), the seed layers may be grown using chemical vapor deposition ("CVD"). In other instances still (not show), the seed layers may be grown using plasma enhanced chemical vapor deposition ("PECVD").

Each seed layer 78 will continue to grow until the respective conductive layer 110 makes contact with a corresponding region of the sacrificial layer 90 at which point the respective conductive layer 110 is blocked from growing closer to the micro-shell resonator 54 by the sacrificial layer 90. The blocked conductive layer 110 may continue to grow in other directions. For example, the conductive layer 110 may grow above and below the discrete electrode 34. However, the conductive layer 110 will not grow closer to the micro-shell resonator 54. Thus, respective growth periods are dependent upon the respective gaps between the seed layer 78 and the sacrificial layer 90.

For example only, the conductive layer 110 may comprise copper, nickel, tin, indium, zinc, gold, silver, platinum, rhodium, lead, palladium, zinc, zinc-nickel, palladium-nickel, palladium-cobalt, iron, stainless steel, palladium-cobalt, chromium, brass, cadmium, iridium, nickel-chromium, iron-chrome-nickel, tungsten, molybdenum, germanium, aluminum, ruthenium, tin-lead, titanium, aluminum-titanium, cadmium-titanium, carbon, zinc oxide, silicon gallium arsenide, gallium phosphide, indium arsenide, indium antimonide, indium sulfide, lead sulfide, cadmium telluride, cadmium selenide, zinc selenide, zinc telluride, zinc cadmium selenide, cadmium zinc telluride, cadmium sulfide, copper sulfide, indium selenide, copper indium selenide, mercury cadmium telluride, titanium oxide, tungsten oxide, copper oxide, lead oxide, or combinations thereof.

As seen in FIG. 1T, following growth of the conductive layer 110 the sacrificial layer 90 is dissolved and the micro-shell resonator 54 is released. For example only, the sacrificial layer 90 may be dissolved using dry or wet etching, combusting, melting, milling, or ion bombardment. Removal of the substantially uniform sacrificial layer 90 leaves a substantially uniform gap 116 between the micro-shell resonator 54 and the respective discrete electrodes 34. Lastly, as seen in FIG. 1U, contact pads 112 are deposited through the vertical feedthroughs 68 to form electrical connections to the discrete electrodes 34.

FIGS. 2A-2D illustrate another exemplary method for fabricating a high-performance vibratory gyroscope 120 using a sacrificial layer similar to the method illustrated in FIGS. 1A-1U. In particular, FIGS. 2A-2D illustrate a method for creating substantially uniform gaps 122 between the micro-shell resonator 124 and the discrete electrodes 126 that surround the micro-shell resonator 124.

FIG. 2A illustrates the fabrication of the electrode substrate 128, including top and bottom substrates 148, 150, a plurality of discrete electrodes 126 having sidewalls 136 and seed layers 138 deposited thereon, a mounting region 134, and a boundary 142; and the coating of a micro-shell resonator 124, including a rim 144 and an anchor 146, with an electrical conductor layer 132 and a substantially uniform sacrificial layer 130. While reference is made to discrete electrodes (e.g., 126) having sidewalls (e.g., 136), it is understood that discrete electrodes may take a variety of forms and that the deposited conductive layer (e.g., 152) has a corresponding shape.

FIG. 2B illustrates the bonding of the micro-shell resonator 124 and the electrode substrate 128. Particularly, the rim 144 of the micro-shell resonator 124 faces the electrode substrate 128 and the anchor 146 of the micro-shell resonator 124 bonds to the mounting region 140 of the electrode substrate 128. Next, as seen in FIG. 2C, electroplating techniques are used to grow the respective seed layers 138 (e.g., deposit a conductive layer 152 onto the seed layers 138). Lastly, as seen in FIG. 2D, the sacrificial layer 130 is removed (e.g., dissolved) and the micro-shell resonator 124 released.

FIGS. 3A-3D illustrate another exemplary method for fabricating a high-performance vibratory gyroscope 480 similar to the method illustrated in FIGS. 2A-2D except the rim 500 of the micro-shell resonator 494 faces away from the electrode substrate 484.

FIG. 3A illustrates an electrode substrate 484 having top and bottom substrates 486, 490 and a middle substrate 488 deposed therebetween. The substrates 486, 488, and 490 are patterned to have corresponding recesses 492 and to form a center pillar (e.g., anchor post) 504. The recesses 492 are defined to receive the micro-shell resonator 494 having a rim 500 and an anchor 502. The top substrate 486 is further patterned to form a plurality of discrete electrodes 506 and a boundary 510. Seed layers 508 are deposited on the sidewalls 514 of the discrete electrodes 506, the sidewalls 512 of the boundary 510, and the sidewalls 516 of the center pillar 504.

FIG. 3B illustrates the bonding of the micro-shell resonator 494 and the electrode substrate 484. The anchor 502 of the micro-shell resonator 494 bonds to the center pillar 504, and the rim 500 of the micro-shell resonator 494 faces away from the electrode substrate 484. The micro-shell resonator 494 is coated with an electrical conductor layer 518 and a substantially uniform sacrificial layer 520. Next, as seen in FIG. 3C, electroplating techniques are used to deposit conductive layers 522 (e.g., grow the seed layers 508) and to fill the respective gaps between the micro-shell resonator 494 and the discrete electrodes 506. Lastly, as seen in FIG. 3D, the sacrificial layer 520 is removed and the micro-shell resonator 494 released.

FIGS. 4A-4D illustrate another exemplary method for fabricating a high-performance vibratory gyroscope 230 similar to the method illustrated in FIGS. 2A-2D except the sacrificial layer 232 is deposited onto the micro-shell resonator 234 after the resonator 234 is bonded to mounting region 252 of the electrode substrate 236.

FIG. 4A illustrates a micro-shell resonator 234, including a rim 248 and an anchor 250, coated with an electrode layer 246 bond to a mounting region 252 of an electrode substrate 236 including top and bottom substrates 254, 256, a plurality of discrete electrodes 244 having sidewalls 258 and seed layers 238 deposited thereon, and a boundary 260. The rim 248 of the bounded micro-shell resonator 234 faces the electrode substrate 236.

FIG. 4B illustrates the depositing of a sacrificial layer 232 onto the exposed surfaces of the micro-shell resonator 234. Next, as seen in FIG. 4C, electroplating techniques are used to conductive layers 262 onto the respective seed layers 238. Conductive layers 262 can be grown only from seed layers 238 connected to an electric current supply. In the present instance, only seed layers 238 facing the exterior of the micro-shell resonator 234 are connected to an electric current supply (supply). Thus, growth is seen only on those seed layers 238 facing the exterior of the micro-shell resonator 234. Growth of each respective conductive layer 262 will continue until the respective conductive layer 262 makes contact with the corresponding region of the sacrificial layer 232.

FIGS. 5A-5D illustrate another exemplary method for fabricating a high-performance vibratory gyroscope 540 similar to the method illustrated in FIGS. 4A-4D except the rim 542 of the micro-shell resonator 544 faces away from the electrode substrate 546.

FIG. 5A illustrates an electrode substrate 546 having top and bottom substrates 548, 552 and a middle substrate 550 deposed therebetween. The substrates 548, 550, and 552 are patterned to have corresponding recesses 554 and to form an anchor post 556. The recesses 554 receive the micro-shell resonator 544 having a rim 542 and an anchor 558 and coated with and electrical conductor layer 572. The anchor 558 of the micro-shell resonator 544 bonds to the anchor post 556 and the rim 542 faces away from the electrode substrate 546. The top substrate 548 is further patterned to form a plurality of discrete electrodes 560 and a boundary 562. Seed layers 564 are deposited on the sidewalls 566 of the discrete electrodes 560, the sidewalls 568 of the boundary 562, and the sidewalls 570 of the anchor post 556.

FIG. 5B illustrates the coating of the micro-shell resonator 544 with a substantially uniform sacrificial layer 574. Next, as seen in FIG. 5C, electroplating is used to grow the respective seed layers 564 (e.g., deposit conductive layers 576). Lastly, as seen in FIG. 5D, the sacrificial layer 574 is removed and the micro-shell resonator 544 released.

FIGS. 6A-6D illustrate another exemplary method for fabricating a high-performance vibratory gyroscope 270 using a movable jig 272 similar to the method illustrated in FIGS. 1A-1U. In particular, FIGS. 6A-6C illustrate an exemplary method of fabrication a high-performance vibratory gyroscope 270 using a plurality of movable jigs 272 aligned on opposing sides of the micro-shell resonator 274 to align the micro-shell resonator 274 with a mounting region (e.g., center) 284 of the electrode substrate 286 to which the micro-shell resonator 274 is bound.

FIG. 6A illustrates a micro-shell resonator 274, including a rim 280 and an anchor 282, bond to a mounting region 284 of an electrode substrate 286 including a top substrate 288 and a bottom substrate 290 having a plurality of discrete electrodes 298 bounded thereto and a boundary 296. The rim 280 of the bonded micro-shell resonator 274 faces the electrode substrate 286. The movable jigs 272 are suspended from the bottom substrate 290. The movable jigs 272 and corresponding discrete electrodes 298 have a zero positional misalignment because the movable jigs 272 and corresponding discrete electrodes 298 were formed using a single lithography step.

FIG. 6B illustrates the movement of the respective movable jigs 272 towards the center 284 of the electrode substrate 286. A micro-manipulator (not shown) may cause the movement of the movable jigs 272. The movable jigs 272 make contact with corresponding regions of the micro-shell resonator 274 and apply a gentle compressive force. After the movable jigs 272 have moved a predetermined distance, corresponding latches (FIGS. 7A-7B) are activated and the movable jigs 272 are locked in place, allowing for the removal of the micro-manipulator. The latches allow the movable jigs 272 to continue to apply a compressive force to the micro-shell resonator 274 after release of the micro-manipulator.

The movable jigs 272 surrounding the micro-shell resonator 274 are substantially uniform. Therefore, substantially uniform compressive forces can be applied to the micro-shell resonator 274 from all directions by the plurality of movable jigs 272. The compressive forces of the movable jigs 272 force substantial alignment of the micro-shell resonator 274 and the electrode substrate 286. FIG. 6C illustrates the release of the movable jigs 272.

FIGS. 7A-7B illustrate the latch mechanism coupled to the movable jigs 272 described in FIGS. 6A-6C.

As seen in FIG. 7A, the movable jig 272 is coupled to a folded beam suspension 300 having two substantially straight beams 302A, 302B and a first tooth 304. The two beams 302A, 302B are substantially parallel. The folded beam suspension 300 is coupled to a first anchor 312. In certain instances, the first anchor 312 may be attached to the bottom substrate 290 using a bonding layer (see, e.g., FIG. 9A). In other instances, the first anchor 312 may be permanently bonded to the bottom substrate 290.

A rack 306 is perpendicular to the folded beam suspension 300 and has a second tooth 308 and a third substantially straight beam 310. The rack 306 is coupled to a second anchor 314. If the folded beam suspensions 300 is deflected towards the shell by more than the side length 316 of the second tooth 308 the teeth 304, 308 will engage with one another and latch the movable jig 272, as seen in FIG. 7B. Thus, the amount of compressive force that may be applied to the micro-shell resonator 274 by the movable jig 272 is dependent upon length 318 of the straight beams 302A, 302B and the side length 316 of the second tooth 308 of the rack 306.

FIG. 8A-8D illustrate another exemplary method for fabricating a high-performance vibratory gyroscope 590 similar to the method illustrated in FIGS. 6A-6C except the rim 594 of the micro-shell resonator 592 faces away from the electrode substrate 598.

FIG. 8A illustrates an electrode substrate 598 having top and bottom substrates 548, 552 and a middle substrate 550 deposed therebetween. The substrates 600, 602, and 604 are patterned to have corresponding recesses 606 and to form an anchor post 608. The recesses 606 receive the micro-shell resonator 592 having a rim 610 and an anchor 596. The anchor 596 of the micro-shell resonator 592 bonds to the anchor post 608 and the rim 610 faces away from the electrode substrate 598. The top substrate 600 is further patterned to form a plurality of movable jigs 616 and a boundary 618.

FIG. 8B illustrates the movement of the respective movable jigs 616 towards the center 620 of the electrode substrate 598. The movable jigs 616 make contact with corresponding regions of the micro-shell resonator 592 and apply a gentle compressive force. The compressive forces of the movable jigs 616 force substantial alignment of the micro-shell resonator 592 to the center of the electrode substrate 598. FIGS. 8C and 8D illustrate the release of the movable jigs 616. In certain instances, as seen in FIG. 8C, the detachment of the movable jigs 616 occurs by removing the bonding layer anchoring the movable jig 616 to the middle substrate 602. In other instances, as seen in FIG. 8D, the detachment of the movable jigs 616 occurs by applying a downward force on the movable jigs 616 to bond the movable jig to the middle substrate 602.

FIGS. 9A-9B illustrate another exemplary method for fabricating a high-performance vibratory gyroscope 630 similar to the method illustrated in FIGS. 6A-6C except the jig is fixed. In particular, FIGS. 9A-9B illustrate a method for aligning the lateral position of the micro-shell resonator 632 with respect to an electrode substrate 640 using monolithically defined fixed jigs 648. The rim 634 of the bounded micro-shell resonator 632 faces the electrode substrate 640.

FIG. 9A illustrates a micro-shell resonator 632, including a rim 634 and an anchor 636 bond to a mounting region 638 of an electrode substrate 640 including top and bottom substrates 642, 644. The bottom substrate 644 includes a plurality of recesses 650 and bottom electrodes 652 deposited therein. The top substrate 642 is patterned to form the mounting region 638, a boundary 646, a plurality of fixed jigs 648, and a plurality of discrete electrodes 654. The top substrate 642 is patterned using a single lithography step, eliminating potential misalignment of the mounting region 638, the boundary 646, the plurality of fixed jigs 648, and the plurality of discrete electrodes 654. The discrete electrodes 654 are directly bonded to the bottom substrate 644. The fixed jigs 648 are bonded to the bottom substrate 644 using a bonding layer 656. The micro-shell resonator 632 has a diameter that is slightly smaller than the distance between corresponding fixed jigs 648. Thus, the alignment of the micro-shell resonator 632 is controlled by the spatial relationship between the micro-shell resonator 632 and the fixed jigs 648. FIG. 9B illustrates the etching of the bonding layer 656, the release of the fixed jigs 648, and the consequential release of the micro-shell resonator 632.

FIGS. 10A-10B illustrate another exemplary method for fabricating a high-performance vibratory gyroscope 670 similar to the method illustrated in FIGS. 9A-9B except the rim 672 of the micro-shell resonator 676 faces away from the electrode substrate 678.

FIG. 10A illustrates an electrode substrate 678 having top and bottom substrates 680, 684 and a middle substrate 682 deposed therebetween. The substrates 680, 682, and 684 are patterned to have corresponding recesses 686 and to form an anchor post 688. The recesses 686 are defined to receive the micro-shell resonator 676 having a rim 672 and an anchor 674. The anchor 674 of the micro-shell resonator 676 bonds to the anchor post 688 and the rim 672 faces away from the electrode substrate 678. The top substrate 680 is further patterned to form a boundary 690, a plurality of fixed jigs 692, and a plurality of discrete electrodes 694. The discrete electrodes 694 are directly bonded to the bottom substrate 684. The fixed jigs 692 are bonded to the bottom substrate 684 using a bonding layer 696. The micro-shell resonator 676 has a diameter that is slightly smaller than the distance between corresponding fixed jigs 692. Thus, the alignment of the micro-shell resonator 676 is controlled by the spatial relationship between the micro-shell resonator 676 and the fixed jigs 692. FIG. 10B illustrates the etching of the bonding layer 696, release of the fixed jigs 692, and the consequential release of the micro-shell resonator 676.

FIG. 11A-11D illustrate another exemplary method for fabricating a high-performance vibratory gyroscope 330 using a leveling layer 334 similar to the method illustrated in FIGS. 1A-1U. In particular, FIGS. 11A-11B illustrate an exemplary method of fabrication a high-performance vibratory gyroscope 330 using a leveling layer 334, allowing for the leveling of the micro-shell resonator 332 with respect to the electrode substrate 336 with high leveling accuracy, and the creation of a large controllable vertical gap 372 between the rim 366 of the micro-shell resonator 332 and the bottom substrate 340. In certain instances, a large gap 372 reduces squeeze-film air damping and increases mechanical factor ("Q"). A high Q provides for high resolution and stability of the gyroscope 330.

As seen in FIG. 11A, the electrode substrate 336 includes top and bottom substrates 338, 340 each having opposing first 342, 346 and second 344, 348 surfaces. The top and bottom substrates 338, 340 are substantially parallel. The first surface 346 of the bottom substrate 340 faces the second surface 344 of the top substrate 338. The first surface 346 of the bottom substrate 340 is patterned to form a plurality of recesses 350. Bottom electrodes 352 are deposited within the formed recesses 350. The top substrate 338 is patterned to form a mounting region 354, a plurality of electrically isolated regions (e.g., discrete electrodes) 356, and a boundary 370, consequently exposing the bottom electrodes 352.

The discrete electrodes 356 each have a first portion (e.g., top portion) and a second portion (e.g., bottom portion) that correspond with the first and second surfaces 342, 344 of the top substrate 338. The top portions are wider than the bottom portions of the discrete electrodes 356. The difference in width between the top portions and bottom portions of the discrete electrodes 356 forms a plurality of corresponding lower vertical and lateral surfaces 362, 364. The leveling layer 334 is suspended between the discrete electrodes 356 and supported by the lower vertical and lateral surfaces 362, 364. The leveling layer 334 is substantially parallel with the electrode substrate 336.

The micro-shell resonator 332, including a rim 366 and an anchor 368, is bond to a mounting region 354 of the electrode substrate 336. The rim 366 of the bonded micro-shell resonator 332 faces the electrode substrate 336 and is supported by the leveling layer 334. The leveling layer 334 ensures that the micro-shell resonator 332 is leveled with respect to the electrode substrate 336. Thus, the gap between the rim 366 and the bottom substrate 340 is controlled by the distance between lower vertical surfaces 362, which supports the leveling layer 334. FIG. 11B illustrates the device 330 after removal of the leveling layer 334 and the release of the micro-shell resonator 332.

FIGS. 12A-12B illustrate an exemplary method for fabrication a high-performance vibratory gyroscope 380 similar to that of FIGS. 11A-11B except the discrete electrodes 382 have a uniform width.

As seen in FIG. 12A, the electrode substrate 392 includes top and bottom substrates 394, 396 each having opposing first 404, 408 and second 406, 410 surfaces. The first surface 408 of the bottom substrate 396 is patterned to form a plurality of recesses 398, wherein a plurality of bottom electrodes 400 are deposited. The top substrate 394 is patterned to form a plurality of electrically isolated regions 382, a plurality of recesses 414, and a boundary 412, consequently exposing the bottom electrodes 400.

Leveling layers 402 are deposited adjacent to the formed recesses 414 and parallel with the second surface 406 of the top substrate linking. The leveling layers 402 support the rim 386 of the micro-shell resonator 384. Thus, the gap 416 between the rim 386 and the bottom electrode 400 is determined by the depth of the recess of the bottom substrate 396. FIG. 12B illustrates the device 380 after removal of the leveling layer 402 and the release of the micro-shell resonator 384.

FIGS. 13A-13B illustrate an exemplary method for fabricating a high-performance vibratory gyroscope 430 similar to that of FIGS. 11A-11B except the micro-shell resonator 432 is supported by a step (e.g., pedestal) 440 patterned into the top substrate 434.

As seen in FIG. 13A, the electrode substrate 438 includes top and bottom substrates 434, 436. The bottom substrate 436 is patterned to form a plurality of recesses 450, wherein bottom electrodes 452 are deposited. The top substrate 434 is patterned to expose the bottom electrode 452 and to form a mounting region 454, a plurality of electrically isolated regions (e.g., discrete electrodes) 456, and a boundary 458. A step 440 is patterned into the electrically isolated regions 456 sandwiching the mounting region 454.

The micro-shell resonator 432, including a rim 460 and an anchor 462, is bonded to a mounting region 454 of the electrode substrate 438. The rim 460 faces the electrode substrate 438 and is supported by the step 440 of the mounting region 454. Thus, the gap 464 between the rim 460 and the bottom electrode 452 is controlled by the height of the step 440. The step 440 is substantially parallel with the electrode substrate 438, causing the micro-shell resonator 432 to also be substantially parallel with the electrode substrate 438. As seen in FIG. 13B, the steps 440 are etched away to release the micro-shell resonator 432.

FIGS. 14A-14L illustrate an exemplary method for fabricating a high-performance vibratory gyroscope 160 similar to the process of FIGS. 1A-1U except the rim 164 of the micro-shell resonator 162 faces away from the electrode substrate 166.

FIG. 14A shows the electrode substrate 166. The electrode substrate 166 includes a first substrate (e.g., top substrate) 168 opposing a second substrate (e.g. bottom substrate) 172, and a middle substrate 170 sandwiched therebetween. The top, middle, and bottom substrates 168, 170, 172 are substantially parallel. The bottom substrate 172 includes a plurality of recesses 182 and protrusions 184. The middle substrate 172 is sandwiched between the protrusions 184 of the bottom substrate 172 and the planar top substrate 168.

The middle substrate 170 is an electrical insulator and includes a first surface 178 opposing a second surface 180. The first surface 178 of the middle substrate 170 faces the top substrate 168 and the second surface 180 faces the protrusions 184 of the bottom substrate 172. The first surface 178 of the middle substrate 170 includes a plurality of recesses 174 and protrusions 176. The protrusions 176 make contact with the top substrate 168. The top substrate 168 is an electrical conductor. A protective layer 186 corresponding with the recesses 174 of the middle substrate 170 is deposited on a first surface 188 of the top substrate 168 (e.g., the protective layer 186 is deposited on the first surface 188 of the top substrate 168 adjacent to the protrusions 176 of the middle substrate 170).

The protective layer 186 prevents the middle substrate 170 and the bottom substrate 172 from being attacked during the subsequent etching of the top substrate 168 (see FIG. 14B). The protective layer 186 comprises a material that is selectively removable from the substrates 168, 170, 172. For example only, the protective layer 186 may comprise a metal, a polymer, a semiconductor, dielectric material, or a combination thereof. For example only, the metal may be selected from the group consisting of: gold, silver, platinum chrome, aluminum platinum, iridium, copper, iron, titanium, nickel, cobalt, indium, tin, cadmium, tungsten, rubidium, molybdenum, palladium, zinc, rhodium, germanium, lead, and combinations thereof. For example only, the polymer may be selected from the group consisting of: polyimide, photoresist, Waferbond CR200, crystalbond, shellac, and combinations thereof. For example only, the semiconductor may be selected from the group consisting of: silicon, gallium arsenide, gallium phosphide, indium arsenide, silicon germanium, zinc oxide, and combinations thereof. The dielectric material may be selected from the group consisting of: alumina, titanium oxide, chrome oxide, silicon dioxide, silicon nitride, glass, fused silica, and combinations thereof.

Next, as seen in FIG. 14B, the top substrate 168 is patterned from a second surface 190, which opposes the first surface 188 of the top substrate 168, to form a plurality of etch holes 192. The etch holes 192 define the discrete electrodes 194, the movable jigs 195, the boundary 196, and the anchor post 198. The discrete electrodes 194 are anchored to the middle substrate 170, while the movable jigs 195 are suspended from the middle substrate 170. A seed layer 200 is then deposited on select regions of the second surface 190 of the top substrate 168 and on the sidewalls of the etch holes 192 (e.g., the seed layer 200 coats the feedthroughs), as seen in FIG. 14C. The seed layer 200 may be deposited using shadow masking techniques.

Next, as seen in FIG. 14D, the seed layer 200 on the second surface 190 of the top substrate 168 (e.g., the lateral surfaces) is etched away. The seed layer 200 may be etched using a directional etching method, reactive-ion etching ("RIE"), or wet etching. The regions of the top substrate 168 suspended between the protrusions 184 of the bottom substrate 172 are then released and the protective layer 186 etched away, as seen in FIG. 14E.

Next, as seen in FIG. 14F, the exposed surface of the anchor post 198 is recessed to correspond with the height difference between a bottom surface 206 of the anchor 202 of the micro-shell resonator 162 and the rim 204 of the micro-shell resonator 162 (shown in FIG. 12H). Bonding layers 210 and contact pads 212 are then deposited, as seen in FIG. 14G. The contact pads 212 may be deposited onto all discrete electrodes 194 from which electrical signals will be read. The bonding layer 210 may be deposited when the micro-shell resonator 162 is bonded using solder or thermal compression bonding. For example only, the contact pads 212 and bonding layer 210 may comprise titanium-platinum, titanium-gold, chromium-platinum, chromium-gold, or combinations thereof.

Next, as seen in FIG. 14H, the micro-shell resonator 162 is coated with an electrode layer 208 and aligned with the anchor post 198. The rim 204 of the micro-shell resonator 162 faces away from the electrode substrate 166 (e.g., the micro-shell resonator 162 is placed face-up with respect to the anchor post 198). In certain instances, the movable jigs 195 will then be pushed by a micro-manipulator (not shown) towards the center of the micro-shell resonator 162, as seen in FIG. 14I. The movable jigs 195 makes contact with the micro-shell resonator 162 and pushes the resonator 162 is the desired direction. After the desired position is obtained (e.g., equal alignment of the micro-shell resonator 162 and the discrete electrodes 194) the micro-manipulator may be removed and the movable jigs 195 held in place by a plurality of latches (FIGS. 7A-7B).

After the micro-shell resonator 162 is coated with the electrode layer 208 and aligned with the anchor post 198 a leveling layer 214 is used to bond the micro-shell resonator 162 to the anchor post 198, as seen in FIG. 14J. The leveling layer 214 is substantially parallel with the electrode substrate 166 and applies a substantially uniform force in the direction of the electrode substrate 166 to bond the anchor 202 of the micro-shell resonator 162 to the anchor post 198. After the anchor 202 of the micro-shell resonator 162 is bound to the anchor post 198, the leveling layer 214 is released and a sacrificial layer 216 is bond to the exposed surfaces of the micro-shell resonator 162, as seen in FIG. 14K.

Next, as seen in FIG. 14L, the seed layers 200 are grown (e.g., conductive layer 220 deposited) to fill the gaps 218 between the micro-shell resonator 162 and the discrete electrodes 194 (see FIG. 14K). The seed layers 200 are grown using electroplating techniques. The seed layer 200 will continue to grow until the conductive layer 220 makes contact with a corresponding region of the sacrificial layer 216 at which point the conductive layer 220 is blocked from growing closer to the micro-shell resonator 162 by the sacrificial layer 216. After each gap 218 is filled, the sacrificial layer 216 will be dissolved, leaving a substantially uniform gap 222 between the micro-shell resonator 162 and the respective discrete electrodes 194.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of fabricating a microstructure device, the method comprising:

forming a microstructure on a substrate, wherein the substrate includes a plurality of discrete electrodes, the microstructure is formed adjacent to the discrete electrodes, and a first plurality of gaps exists between the microstructure and the discrete electrodes;

depositing a substantially uniform sacrificial layer onto exposed surfaces of the microstructure;

depositing a plurality of conductive layers onto the discrete electrodes to fill the first gaps; and dissolving the sacrificial layer to release the microstructure, wherein dissolving of the sacrificial layer creates a second plurality of gaps between the microstructure and the conductive layers, each second gap has a width that is smaller than that of the corresponding first gap, and the second gaps of the second plurality of gaps are substantially uniform with each other.

2. The method of claim 1, further comprising depositing a plurality of seed layers onto the discrete electrodes, wherein the microstructure is deposited adjacent to the deposited seed layers and the first gap is defined between the seed layers and the discrete electrodes.

3. The method of claim 1, wherein the plurality of conductive layers is deposited using chemical vapor deposition.

4. The method of claim 1, wherein the plurality of conductive layers are deposited using electroplating techniques.

5. The method of claim 1, wherein the depositing of each conductive layer continues until the respective conductive layer makes contact with a corresponding region of the sacrificial layer.

6. The method of claim 1, wherein the depositing of each conductive layer within the corresponding first gap continues until the respective conductive layer makes contact with a corresponding region of the sacrificial layer.

7. The method of claim 1, wherein the conductive layer is selected from the group consisting of: copper, nickel, tin, indium, zinc, gold, silver, platinum, rhodium, lead, palladium, zinc, zinc-nickel, palladium-nickel, palladium-cobalt, iron, stainless steel, palladium-cobalt, chromium, brass, cadmium, iridium, nickel-chromium, iron-chrome-nickel, tungsten, molybdenum, germanium, aluminum, ruthenium, tin-lead, titanium, aluminum-titanium, cadmium-titanium, carbon, zinc oxide, silicon gallium arsenide, gallium phosphide, indium arsenide, indium antimonide, indium sulfide, lead sulfide, cadmium telluride, cadmium selenide, zinc selenide, zinc telluride, zinc cadmium selenide, cadmium zinc telluride, cadmium sulfide, copper sulfide, indium selenide, copper indium selenide, mercury cadmium telluride, titanium oxide, tungsten oxide, copper oxide, lead oxide, and combinations thereof.

8. The method of claim 1, wherein the sacrificial layer is dissolved using a process selected from the group consisting of: dry etching, wet etching, combusting, melting, milling, ion bombardment, and combinations thereof.

9. The method of claim 1, wherein the microstructure is a three-dimensional micro-shell resonator and has a hollow half toroid shape.

10. The method of claim 1, wherein the substrate further includes a leveling layer that supports at least a portion of the microstructure as the microstructure is coupled to the substrate.

11. The method of claim 1, wherein the microstructure includes a rim and an anchor, the substrate includes a mounting surface, and the anchor of the microstructure is bonded to the mounting surface of the substrate.

12. The method of claim 11, wherein the substrate further includes a leveling layer, a portion of the rim is supported by the leveling layer during bonding of the anchor to the mounting surface, and the leveling layer is removed after bonding.

13. The method of claim 11, wherein the substrate further includes a plurality of movable jigs, the movable jigs apply a compressive force to align the microstructure with the substrate, and after alignment the microstructure is bonded to the mounting surface of the substrate and the movable jigs released.

14. The method of claim 11, wherein the substrate further includes a plurality of fixed jigs, the fixed jigs define an opening, and the microstructure is deposited within the defined opening.

15. A method of fabricating a three-dimensional microstructure device, the method comprising:
    micromachining a substrate to form a plurality of discrete electrodes having a plurality of sidewalls;
    depositing seed layers onto the sidewalls of the discrete electrodes;
    depositing a substantially uniform sacrificial layer onto exposed surfaces of a three-dimensional microstructure;
    depositing the three-dimensional microstructure adjacent to the sidewalls of the discrete electrodes creating a first plurality of gaps between the sacrificial layer and the seed layers;
    depositing a plurality of conductive layers onto the seed layers to fill the first gaps, wherein the depositing of the conductive layers within the first gap continues until the respective conductive layer makes contact with a corresponding region of the sacrificial layer; and
    dissolving the sacrificial layer to release the three-dimensional microstructure, wherein release of the sacrificial layer creates a second plurality of gaps between the three-dimensional microstructure and the conductive layers, each second gap has a width that is smaller than that of the corresponding first gap, and the second gaps of the second plurality of gaps are substantially uniform with each other.

16. The method of claim 15, wherein the plurality of conductive layers are deposited using electroplating techniques.

17. The method of claim 15, wherein the three-dimensional microstructure includes a rim and an anchor, the substrate includes a mounting surface, and the anchor of the three-dimensional microstructure is bonded to the mounting surface of the substrate.

18. The method of claim 17, wherein the substrate further includes a leveling layer, a portion of the rim is supported by the leveling layer during bonding of the anchor to mounting surface, and the leveling layer is removed after bonding.

19. The method of claim 17, wherein the substrate further includes a plurality of movable jigs, the movable jigs apply a compressive force to align the microstructure with the substrate, and after alignment the microstructure is bonded to the mounting surface of the substrate and the movable jigs released.

20. The method of claim 17, wherein the substrate further includes a plurality of fixed jigs, the fixed jigs defining an opening, and the microstructure is deposited within the defined opening.

* * * * *